US012808955B2

(12) United States Patent

Takasugi et al.

(10) Patent No.: US 12,808,955 B2
(45) Date of Patent: Nov. 24, 2026

(54) MAGNETIC FIELD DETECTION APPARATUS

(71) Applicant: TDK CORPORATION, Tokyo (JP)

(72) Inventors: Keisuke Takasugi, Tokyo (JP); Kenzo Makino, Tokyo (JP)

(73) Assignee: TDK CORPORATION, Tokyo (JP)

( * ) Notice: Subject to any disclaimer, the term of this patent is extended or adjusted under 35 U.S.C. 154(b) by 135 days.

(21) Appl. No.: 18/999,821

(22) Filed: Dec. 23, 2024

(65) Prior Publication Data

US 2025/0123341 A1 Apr. 17, 2025

Related U.S. Application Data

(63) Continuation-in-part of application No. 18/775,761, filed on Jul. 17, 2024, now abandoned, which is a (Continued)

(30) Foreign Application Priority Data

Sep. 22, 2021 (JP) ................................ 2021-154816
Jan. 26, 2022 (JP) ................................ 2022-009846
Mar. 3, 2022 (JP) ................................ 2022-032603

(51) Int. Cl.
*G01R 33/09* (2006.01)
*G01R 33/00* (2006.01)

(52) U.S. Cl.
CPC ....... *G01R 33/093* (2013.01); *G01R 33/0005* (2013.01); *G01R 33/0052* (2013.01); *G01R 33/0094* (2013.01)

(58) Field of Classification Search
CPC .............. G01R 33/093; G01R 33/0005; G01R 33/0052; G01R 33/0094; G01R 33/098; G01R 33/09
See application file for complete search history.

(56) References Cited

U.S. PATENT DOCUMENTS 6,582,889 B1 6/2003 Kamijima
2004/0239321 A1 12/2004 Kobayashi et al.
(Continued)

FOREIGN PATENT DOCUMENTS

CN 101142494 A 3/2008
CN 112946538 A 6/2021
(Continued)

OTHER PUBLICATIONS

U.S. Appl. No. 17/946,838, filed Sep. 16, 2022 in the name of Keisuke Takasugi et al.
(Continued)

*Primary Examiner* — Alesa Allgood
(74) *Attorney, Agent, or Firm* — Oliff PLC

(57) ABSTRACT

A magnetic field detection apparatus includes a substrate including a flat surface, and multiple projections including a first projection and a second projection. Each of the multiple projections is provided on the flat surface and includes a first inclined surface and a second inclined surface, the first inclined surface being inclined with respect to the flat surface, the second inclined surface being inclined with respect to both the flat surface and the first inclined surface. A first magnetoresistive effect film is provided on the first inclined surface. A second magnetoresistive effect film is provided on the second inclined surface. A first wiring line couples the first magnetoresistive effect film provided on the first inclined surface of the first projection of the multiple projections and the first magnetoresistive effect film provided on the first inclined surface of the second projection of the multiple projections to each other.

20 Claims, 20 Drawing Sheets

Related U.S. Application Data continuation-in-part of application No. 17/946,838, filed on Sep. 16, 2022, now Pat. No. 12,072,397.

(56) References Cited

U.S. PATENT DOCUMENTS

| | | | | |
|---|---|---|---|---|
| 2008/0169807 | A1* | 7/2008 | Naito | G01R 33/09 257/E27.005 |
| 2008/0316654 | A1 | 12/2008 | Aiso | |
| 2009/0237074 | A1 | 9/2009 | Kou et al. | |
| 2012/0306489 | A1 | 12/2012 | Mori | |
| 2018/0252780 | A1 | 9/2018 | Iwasaki et al. | |
| 2020/0057119 | A1 | 2/2020 | Yuan | |
| 2021/0181241 | A1 | 6/2021 | Ota et al. | |
| 2022/0308095 | A1 | 9/2022 | Ota et al. | |
| 2023/0091010 | A1 | 3/2023 | Takasugi et al. | |
| 2023/0417846 | A1 | 12/2023 | Makino et al. | |
| 2024/0210446 | A1 | 6/2024 | Ota et al. | |
| 2024/0328834 | A1 | 10/2024 | Watanabe | |
| 2025/0271471 | A1 | 8/2025 | Ota et al. | |

FOREIGN PATENT DOCUMENTS

| | | | |
|---|---|---|---|
| JP | 2007-212275 | A | 8/2007 |
| JP | 2012-251892 | A | 12/2012 |
| JP | 2016-001118 | A | 1/2016 |

OTHER PUBLICATIONS

U.S. Appl. No. 17/946,817, filed Sep. 16, 2022 in the name of Keisuke Takasugi et al.

Sep. 22, 2023 Office Action issued in U.S. Appl. No. 17/946,838.

Oct. 23, 2023 Office Action issued in U.S. Appl. No. 17/946,817.

Apr. 12, 2024 U.S. Notice of Allowance issued in U.S. Appl. No. 17/946,838.

Apr. 23, 2024 Office Action issued in U.S. Appl. No. 17/946,817.

English Translation of Jul. 9, 2024 Office Action issued in Japanese Patent Application No. 2022-032603.

Nov. 25, 2024 Office Action issued in U.S. Appl. No. 17/946,817.

English Translation of Jan. 7, 2025 Office Action issued in JP Patent Application No. 2022-032603.

May 8, 2025 Notice of Allowance issued in U.S. Appl. No. 17/946,817.

* cited by examiner

MAGNETIC FIELD DETECTION APPARATUS

CROSS-REFERENCE TO RELATED APPLICATIONS

This application is a continuation-in-part of U.S. Ser. No. 18/775,761 filed on Jul. 17, 2024, which is a continuation-in-part of U.S. Ser. No. 17/946,838 filed on Sep. 16, 2022, which claims priority from Japanese Patent Application Nos. 2021-154816 filed on Sep. 22, 2021, 2022-009846 filed on Jan. 26, 2022, and 2022-032603 filed on Mar. 3, 2022, the entire contents of each of the above applications being incorporated herein by reference.

BACKGROUND

The disclosure relates to a magnetic field detection apparatus including a magnetoresistive effect element.

Some magnetic field detection apparatuses have been proposed that include magnetoresistive effect elements. For example, Japanese Unexamined Patent Application Publication No. 2016-001118 discloses a magnetic field detection apparatus including a magnetoresistive effect element and a conductor that are disposed to allow a centerline of the conductor along a direction in which current flows and a centerline of the magnetoresistive effect element along a longitudinal direction thereof to be oriented in different directions from each other.

SUMMARY

A magnetic field detection apparatus according to one embodiment of the disclosure includes a substrate, multiple projections including a first projection and a second projection, a first magnetoresistive effect film, a second magnetoresistive effect film, and a first wiring line. The substrate includes a flat surface. Each of the multiple projections is provided on the flat surface and includes a first inclined surface and a second inclined surface, the first inclined surface being inclined with respect to the flat surface, the second inclined surface being inclined with respect to both the flat surface and the first inclined surface. The first magnetoresistive effect film is provided on the first inclined surface. The second magnetoresistive effect film is provided on the second inclined surface. The first wiring line couples the first magnetoresistive effect film provided on the first inclined surface of the first projection of the multiple projections and the first magnetoresistive effect film provided on the first inclined surface of the second projection of the multiple projections to each other. The first wiring line includes a first flat part and a first inclined part, the first flat part being provided on the flat surface and extending in a first direction, the first inclined part being provided on the first inclined surface and extending in a second direction. The first flat part is coupled to a middle region of the first inclined part, the middle region being in the second direction and other than both end regions of the first inclined part that are in the second direction.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
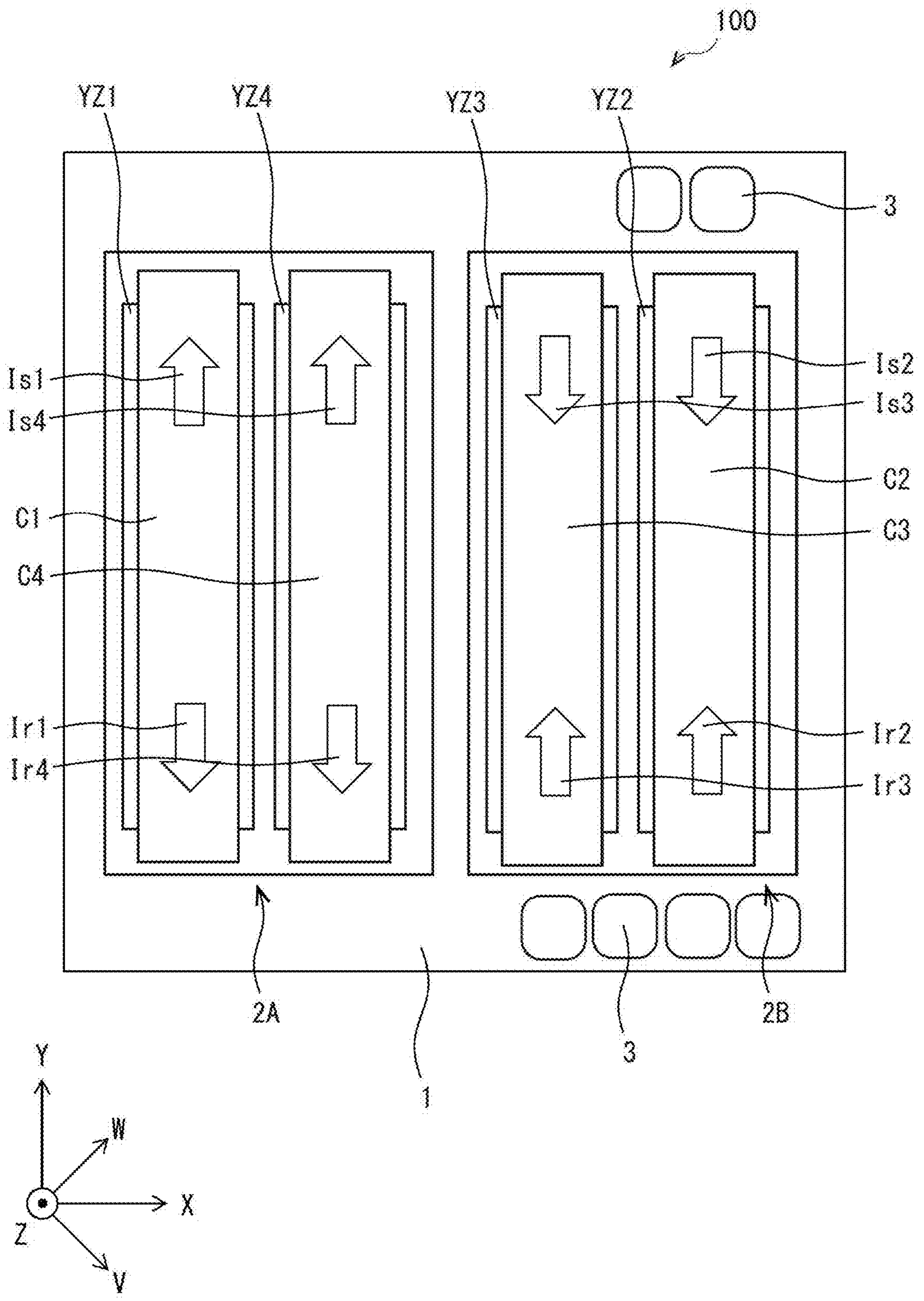
FIG. 1 is a schematic plan diagram illustrating an overall configuration example of a magnetic field detection apparatus according to one example embodiment of the disclosure.

It is desired that a magnetic field detection apparatus including a magnetoresistive effect element be further reduced in size.

It is desirable to provide a magnetic field detection apparatus that lends itself to reduction in size while maintaining high reliability.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

1. EXAMPLE EMBODIMENT

2. MODIFICATION EXAMPLES

1. Example Embodiment

An example of a magnetic field detection apparatus including a bridge circuit. The bridge circuit includes a first magnetoresistive effect film provided on a first inclined surface and a second magnetoresistive effect film provided on a second inclined surface.

Configuration of Magnetic Field Detection Apparatus 100

First, with reference to FIGS. 1 to 6, a description will be given of a configuration of a magnetic field detection apparatus 100 according to an example embodiment of the disclosure.

Overall Configuration of Magnetic Field Detection Apparatus 100

FIG. 1 is a schematic plan diagram illustrating an overall configuration example of the magnetic field detection apparatus 100. The magnetic field detection apparatus 100 may be a two-axis magnetic detection compass that is configured to detect a change in a magnetic field in a Y-axis direction and a change in a magnetic field in a Z-axis direction, for example. The magnetic field detection apparatus 100 is usable as an electromagnetic compass to detect geomagnetism, for example.

As illustrated in FIG. 1, the magnetic field detection apparatus 100 may include, for example, a substrate 1, a magnetic field detection units 2A and 2B, and a terminal part 3. The substrate 1 may extend along an XY plane parallel to an X-axis direction and the Y-axis direction. The substrate 1 may have a thickness along the Z-axis direction. The X-axis direction, the Y-axis direction, and the Z-axis direction are orthogonal to each other. The magnetic field detection units 2A and 2B may be provided in a middle region of the substrate 1 in the XY plane, being adjacent to each other. The terminal part 3 may be provided in a peripheral region of the substrate 1 other than the middle region having the magnetic field detection units 2A and 2B therein. The terminal part 3 may be electrically continuous with the magnetic field detection units 2A and 2B. The terminal part 3 may be an electrode that allows electrical coupling of the magnetic field detection units 2A and 2B to an external apparatus.

The magnetic field detection unit 2A may include an element formation region YZ1 and an element formation region YZ4. For example, the element formation region YZ1 and the element formation region YZ4 may each extend in the Y-axis direction and may be adjacent to each other in the X-axis direction. Magnetoresistive effect films MR1 and magnetoresistive effect films MR4 to be described later may be formed in the element formation region YZ1 and the element formation region YZ4, respectively. The magnetic field detection unit 2A may further include a conductor C1 and a conductor C4. The conductor C1 may overlap the element formation region YZ1 in the Z-axis direction and extend in the Y-axis direction. The conductor C4 may overlap the element formation region YZ4 in the Z-axis direction and extend in the Y-axis direction. The conductors C1 and C4 may be configured to be respectively supplied with setting currents Is1 and Is4 that each flow in a +Y direction. The setting currents Is1 and Is4 may generate setting magnetic fields for carrying out a setting operation on magnetizations of respective magnetization free layers included in the magnetoresistive effect films MR1 and MR4. The conductors C1 and C4 may be further configured to be respectively supplied with resetting currents Ir1 and Ir4 that each flow in a −Y direction. The resetting currents Ir1 and Ir4 may generate resetting magnetic fields for carrying out a resetting operation on the magnetizations of the respective magnetization free layers included in the magnetoresistive effect films MR1 and MR4.

The magnetic field detection unit 2B may include an element formation region YZ2 and an element formation region YZ3. For example, the element formation region YZ2 and the element formation region YZ3 may each extend in the Y-axis direction and may be adjacent to each other in the X-axis direction. Magnetoresistive effect films MR2 and magnetoresistive effect films MR3 to be described later may be formed in the element formation region YZ2 and the element formation region YZ3, respectively. The magnetic field detection unit 2B may further include a conductor C2 and a conductor C3. The conductor C2 may overlap the element formation region YZ2 in the Z-axis direction and extend in the Y-axis direction. The conductor C3 may overlap the element formation region YZ3 in the Z-axis direction and extend in the Y-axis direction. The conductors C2 and C3 may be configured to be respectively supplied with setting currents Is2 and Is3 that each flow in the −Y direction. The setting currents Is2 and Is3 may generate setting magnetic fields for carrying out the setting operation on magnetizations of the respective magnetization free layers included in the magnetoresistive effect films MR2 and MR3. The conductors C2 and C3 may be further configured to be respectively supplied with resetting currents Ir2 and Ir3 that each flow in the +Y direction. The resetting currents Ir2 and Ir3 may generate resetting magnetic fields for carrying out the resetting operation on the magnetizations of the respective magnetization free layers included in the magnetoresistive effect films MR2 and MR3.

Figure 2:
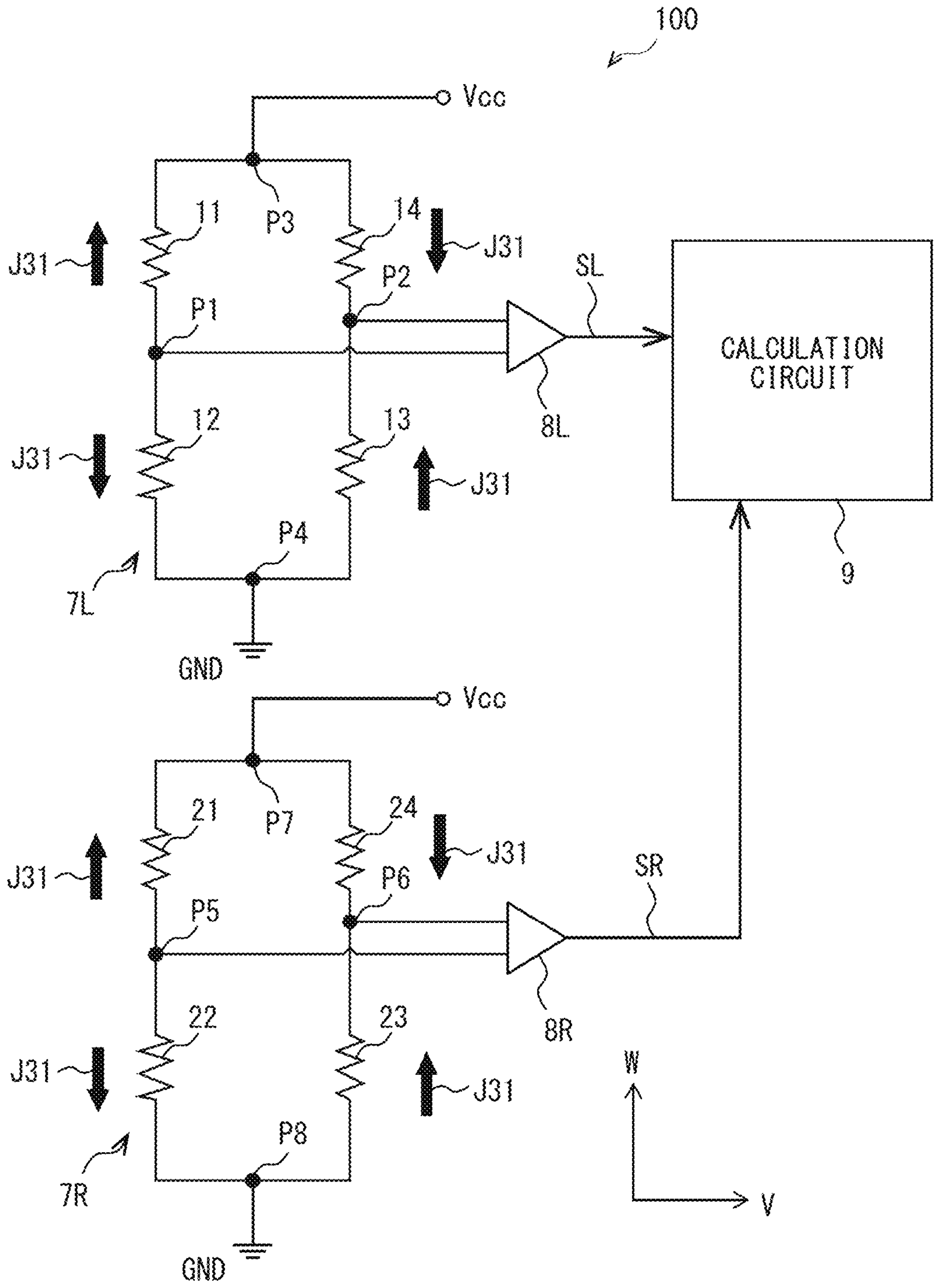
FIG. 2 is a circuit diagram of the magnetic field detection apparatus illustrated in FIG. 1.

FIG. 2 is a circuit diagram illustrating a circuit configuration example of the magnetic field detection apparatus 100.

Circuit Configuration of Magnetic Field Detection Apparatus 100

As illustrated in FIG. 2, the magnetic field detection apparatus 100 may include bridge circuits 7L and 7R, difference detectors 8L and 8R, and a calculation circuit 9. The magnetic field detection apparatus 100 may be configured to detect changes in magnetic fields in the Y-axis direction and the Z-axis direction by using the two bridge circuit 7L and 7R.

The bridge circuit 7L may include four magnetoresistive effect elements 11 to 14. The bridge circuit 7L may have a configuration in which the magnetoresistive effect elements 11 and 12 coupled in series and the magnetoresistive effect elements 13 and 14 coupled in series are coupled to each other in parallel. In a specific but non-limiting example, in the bridge circuit 7L, a first end of the magnetoresistive effect element 11 and a first end of the magnetoresistive effect element 12 may be coupled to each other at a node P1; a first end of the magnetoresistive effect element 13 and a first end of the magnetoresistive effect element 14 may be coupled to each other at a node P2; a second end of the magnetoresistive effect element 11 and a second end of the magnetoresistive effect element 14 may be coupled to each other at a node P3; and a second end of the magnetoresistive effect element 12 and a second end of the magnetoresistive effect element 13 may be coupled to each other at a node P4. Here, the node P3 may be coupled to a power supply Vcc, and the node P4 may be coupled to a ground terminal GND. The node P1 and the node P2 may each be coupled to an input-side terminal of the difference detector 8L, for example.

The magnetoresistive effect elements 11 to 14 may each be configured to detect a change in a signal magnetic field to be detected. For example, the magnetoresistive effect elements 11 and 13 may each decrease in resistance value in response to application of a signal magnetic field in the +Y direction or a signal magnetic field in a +Z direction, and may each increase in resistance value in response to application of a signal magnetic field in the −Y direction or a signal magnetic field in a −Z direction. The magnetoresistive effect elements 12 and 14 may each increase in resistance value in response to application of the signal magnetic field in the +Y direction or the signal magnetic field in the +Z direction, and may each decrease in resistance value in response to application of the signal magnetic field in the −Y direction or the signal magnetic field in the −Z direction. Thus, a signal to be outputted by each of the magnetoresistive effect elements 11 and 13 in response to a change in the signal magnetic field and a signal to be outputted by each of the magnetoresistive effect elements 12 and 14 in response to the change in the signal magnetic field may be different in phase by 180° from each other, for example. A signal extracted from the bridge circuit 7L may flow into the difference detector 8L. The difference detector 8L may detect a potential difference between the node P1 and the node P2, i.e., a difference between a voltage drop occurring at the magnetoresistive effect element 11 and a voltage drop occurring at the magnetoresistive effect element 14, upon application of a voltage between the node P3 and the node P4, and may output the detected difference to the calculation circuit 9 as a difference signal SL.

The bridge circuit 7R may include four magnetoresistive effect elements 21 to 24. The bridge circuit 7R may have a configuration in which the magnetoresistive effect elements 21 and 22 coupled in series and the magnetoresistive effect elements 23 and 24 coupled in series are coupled to each other in parallel. In a specific but non-limiting example, in the bridge circuit 7R, a first end of the magnetoresistive effect element 21 and a first end of the magnetoresistive effect element 22 may be coupled to each other at a node P5; a first end of the magnetoresistive effect element 23 and a first end of the magnetoresistive effect element 24 may be coupled to each other at a node P6; a second end of the magnetoresistive effect element 21 and a second end of the magnetoresistive effect element 24 may be coupled to each other at a node P7; and a second end of the magnetoresistive effect element 22 and a second end of the magnetoresistive effect element 23 may be coupled to each other at a node P8. Here, the node P7 may be coupled to the power supply Vcc, and the node P8 may be coupled to the ground terminal GND. The node P5 and the node P6 may each be coupled to an input-side terminal of the difference detector 8R, for example.

The magnetoresistive effect elements 21 to 24 may each be configured to detect a change in a signal magnetic field to be detected. For example, the magnetoresistive effect elements 21 and 23 may each decrease in resistance value in response to application of the signal magnetic field in the +Y direction or the signal magnetic field in the +Z direction, and may each increase in resistance value in response to application of the signal magnetic field in the −Y direction or the signal magnetic field in the −Z direction. The magnetoresistive effect elements 22 and 24 may each increase in resistance value in response to application of the signal magnetic field in the +Y direction or the signal magnetic field in the +Z direction, and may each decrease in resistance value in response to application of the signal magnetic field in the −Y direction or the signal magnetic field in the −Z direction. Thus, a signal to be outputted by each of the magnetoresistive effect elements 21 and 23 in response to a change in the signal magnetic field and a signal to be outputted by each of the magnetoresistive effect elements 22 and 24 in response to the change in the signal magnetic field may be different in phase by 180° from each other, for example. A signal extracted from the bridge circuit 7R may flow into the difference detector 8R. The difference detector 8R may detect a potential difference between the node P5 and the node P6, i.e., a difference between a voltage drop occurring at the magnetoresistive effect element 21 and a voltage drop occurring at the magnetoresistive effect element 24, upon application of a voltage between the node P7 and the node P8, and may output the detected difference to the calculation circuit 9 as a difference signal SR.

Configuration of Element Formation Regions YZ1 to YZ4

Figure 3:
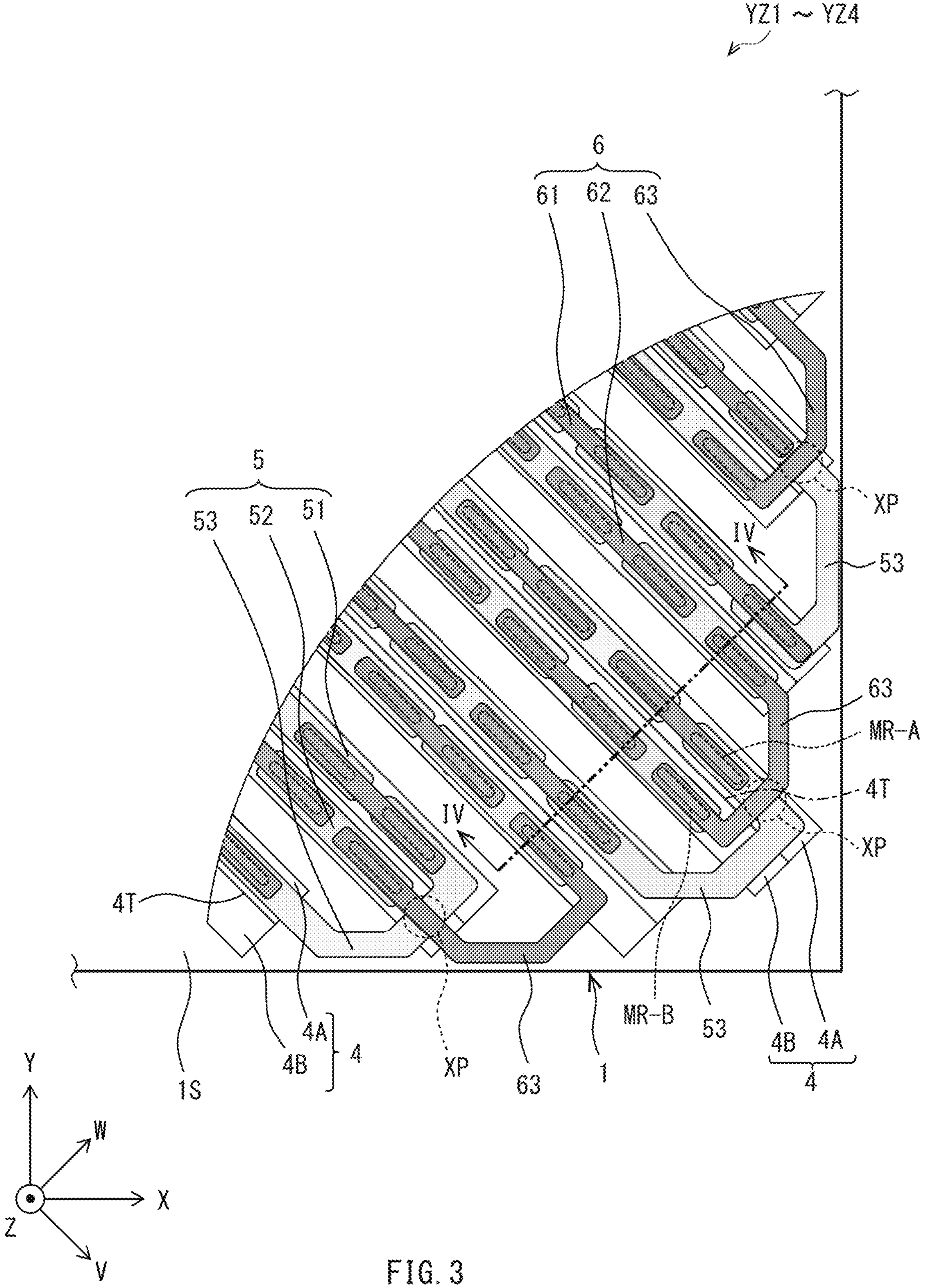
FIG. 3 is a schematic plan diagram illustrating a plan configuration of an element formation region illustrated in FIG. 1.
Figure 4:
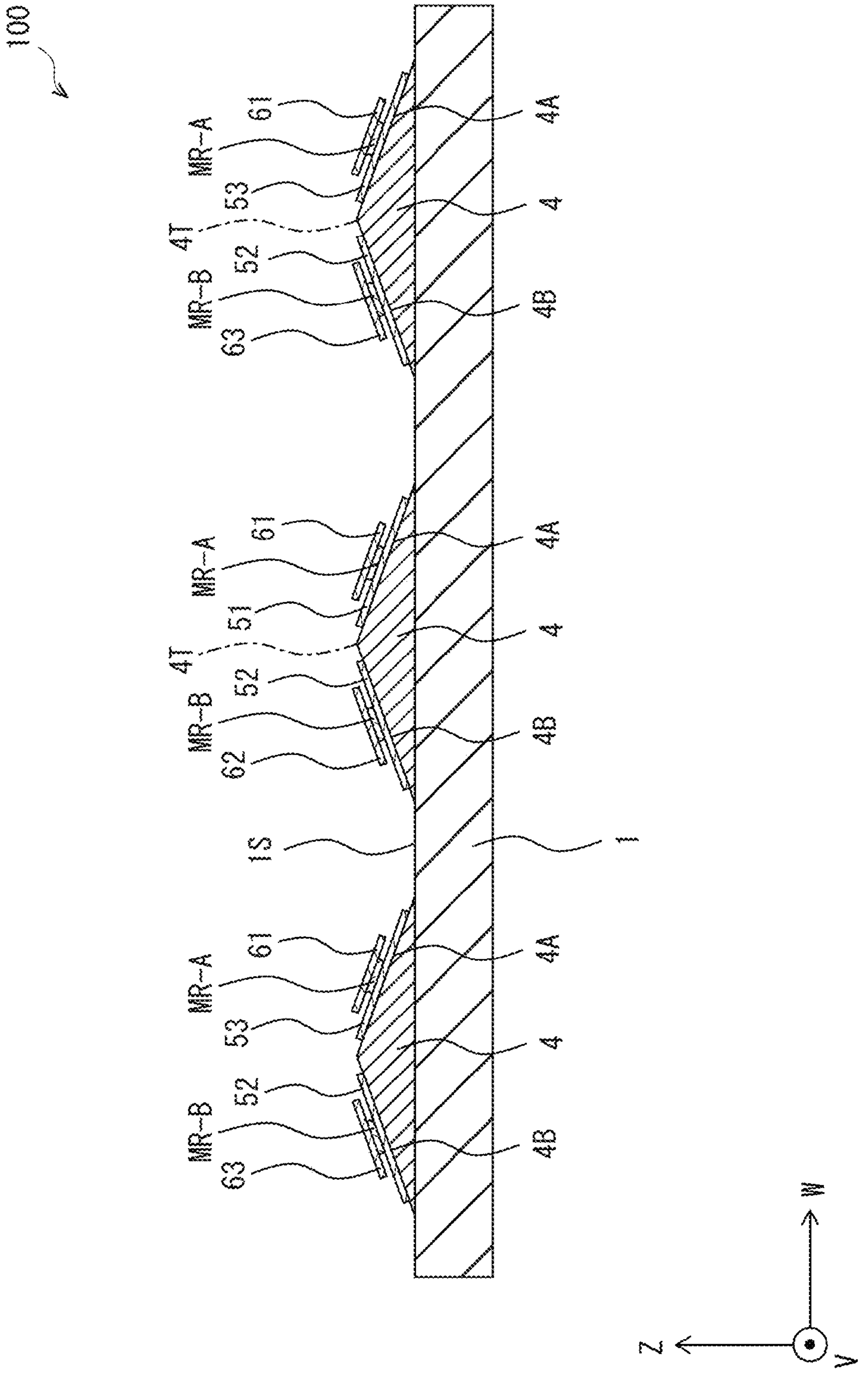
FIG. 4 is a schematic cross-sectional diagram illustrating a cross-sectional configuration of the element formation region illustrated in FIG. 1.

FIG. 3 is an enlarged schematic plan view of a portion of each of the element formation regions YZ1 to YZ4. FIG. 4 is an enlarged schematic cross-sectional view of a portion of each of the element formation regions YZ1 to YZ4. FIG. 4 illustrates a cross section taken along line IV-IV in FIG. 3 as viewed in the arrowed direction.

As illustrated in FIGS. 3 and 4, the element formation regions YZ1 to YZ4 may each include the substrate 1, a plurality of projections 4, a plurality of magnetoresistive effect films MR-A, a plurality of magnetoresistive effect films MR-B, a lower wiring line group 5, and an upper wiring line group 6. The magnetoresistive effect films MR-A may be coupled to each other in series by the lower wiring line group 5 and the upper wiring line group 6. The magnetoresistive effect films MR-B may be coupled to each other in series by the lower wiring line group 5 and the upper wiring line group 6.

The substrate 1 has a flat surface 1S. The flat surface 1S may extend along the XY plane. The substrate 1 may include a material such as $Al_2O_3$, $SiO_2$, or SiN.

The projections 4 are each provided on the flat surface 1S, and may each project upward, i.e., in the +Z direction from the flat surface 1S. The projections 4 may include an insulating material such as silicon oxide (SiOx). The projections 4 may each extend, for example, in a V-axis direction and may be arranged to be adjacent to each other in a W-axis direction. In one example, as illustrated in FIGS. 3 and 4, the projections 4 may be spaced apart from each other on the flat surface 1S. The flat surface 1S of the substrate 1 may thus be exposed between two projections 4 adjacent to each other in the W-axis direction. Note that the V-axis direction and the W-axis direction are parallel to the XY plane, but are non-parallel to each of the X-axis direction and the Y-axis direction. For example, the V-axis direction and the W-axis direction may each be at 45° with respect to both the X-axis direction and the Y-axis direction. Further, the V-axis direction and the W-axis direction may be orthogonal to each other.

The projections 4 each have an inclined surface 4A and an inclined surface 4B. The inclined surfaces 4A and 4B are non-parallel to the flat surface 1S. The inclined surfaces 4A and 4B are thus inclined with respect to the flat surface 1S. The inclined surfaces 4A and 4B may form a top part 4T extending in the V-axis direction, and may each be inclined in such a manner that a distance to the flat surface 1S decreases with increasing distance from the top part 4T. Thus, in other words, the inclined surfaces 4A and 4B are non-parallel to each other and are inclined with respect to each other.

The inclined surface 4A may correspond to a specific but non-limiting example of a "first inclined surface" according to one embodiment of the disclosure. The inclined surface 4B may correspond to a specific but non-limiting example of a "second inclined surface" according to one embodiment of the disclosure.

The magnetoresistive effect films MR-A are provided on the inclined surface 4A of each projection 4. The magnetoresistive effect films MR-A may be arranged along the V-axis direction which is a longitudinal direction of the inclined surface 4A. The magnetoresistive effect films MR-A may each extend with a longitudinal direction thereof along the V-axis direction. Likewise, the magnetoresistive effect films MR-B are provided on the inclined surface 4B of each projection 4. The magnetoresistive effect films MR-B may be arranged along the V-axis direction which is a longitudinal direction of the inclined surface 4B. The magnetoresistive effect films MR-B may each extend with a longitudinal direction thereof along the V-axis direction.

The magnetoresistive effect films MR-A may each correspond to a specific but non-limiting example of a "first magnetoresistive effect film" according to one embodiment of the disclosure. The magnetoresistive effect films MR-B may each correspond to a specific but non-limiting example of a "second magnetoresistive effect film" according to one embodiment of the disclosure.

The lower wiring line group 5 may be provided below the magnetoresistive effect films MR-A and MR-B, that is, between the magnetoresistive effect film MR-A and the inclined surface 4A, and between the magnetoresistive effect film MR-B and the inclined surface 4B. The lower wiring line group 5 may include a plurality of lower wiring lines 51, a plurality of lower wiring lines 52, and a plurality of lower wiring lines 53. The lower wiring lines 51 each couple respective bottom surfaces of two magnetoresistive effect films MR-A adjacent to each other on the inclined surface 4A of the same projection 4. The lower wiring lines 52 each couple respective bottom surfaces of two magnetoresistive effect films MR-B adjacent to each other on the inclined surface 4B of the same projection 4. The lower wiring lines 53 each couple respective bottom surfaces of two magnetoresistive effect films MR-A provided on the inclined surfaces 4A of two different projections 4.

The upper wiring line group 6 may be provided over the magnetoresistive effect films MR-A and MR-B, that is, on a side of the magnetoresistive effect film MR-A farther from the inclined surface 4A and on a side of the magnetoresistive effect film MR-B farther from the inclined surface 4B. The upper wiring line group 6 may include a plurality of upper wiring lines 61, a plurality of upper wiring lines 62, and a plurality of upper wiring lines 63. The upper wiring lines 61 each couple respective top surfaces of two magnetoresistive effect films MR-A adjacent to each other on the inclined surface 4A of the same projection 4. The upper wiring lines 62 each couple respective top surfaces of two magnetoresistive effect films MR-B adjacent to each other on the inclined surface 4B of the same projection 4. The upper wiring lines 63 each couple respective top surfaces of two magnetoresistive effect films MR-B provided on the inclined surfaces 4B of two different projections 4.

Thus, the plurality of magnetoresistive effect films MR-A provided on the inclined surfaces 4A may be coupled to each other in series by the lower wiring lines 53, the upper wiring lines 61, and the lower wiring lines 51 into a single magnetoresistive effect film array. For example, each of the magnetoresistive effect films MR-A may be disposed between corresponding one of the upper wiring lines 61 and corresponding one of the lower wiring lines 51, or between corresponding one of the upper wiring lines 61 and corresponding one of the lower wiring lines 53. Note that a lower wiring line 53SP and a lower wiring line 53E that are located at a starting end and a terminal end, respectively, of the magnetoresistive effect film array including the plurality of magnetoresistive effect films MR-A may be coupled to respective different terminal parts 3.

Likewise, the plurality of magnetoresistive effect films MR-B provided on the inclined surfaces 4B may be coupled to each other in series by the upper wiring lines 63, the lower wiring lines 52, and the upper wiring lines 62 into a single magnetoresistive effect film array. For example, each of the magnetoresistive effect films MR-B may be disposed between corresponding one of the upper wiring lines 63 and corresponding one of the lower wiring lines 52, or between corresponding one of the upper wiring lines 62 and corresponding one of the lower wiring lines 52. Note that an upper wiring line 63SP and an upper wiring line 63E that are located at a starting end and a terminal end, respectively, of the magnetoresistive effect film array including the plurality of magnetoresistive effect films MR-B may be coupled to respective different terminal parts 3.

Here, the lower wiring line 53 and the upper wiring line 63 intersect on the inclined surface 4A, the inclined surface 4B, or both to form at least one cross point XP. At the cross point XP, the lower wiring line 53 and the upper wiring line 63 may be substantially orthogonal to each other. FIG. 3 illustrates an example in which the cross point XP is provided on each of the inclined surfaces 4A and 4B. However, the lower wiring line 53 and the upper wiring line 63 may be configured not to intersect on the flat surface 1S of the substrate 1. As used herein, the wording "to intersect" refers to such a positional relationship that the upper wiring line 63 lies across the lower wiring line 53 as viewed in the Z-axis direction, i.e., in the stacking direction. Further, the wording "to intersect" encompasses a case where the upper wiring line 63 is located to overlap at least one of opposite edges in a width direction of the lower wiring line 53 in the Z-axis direction. Thus, in the present example embodiment, even in a case where the upper wiring line 63 and the lower wiring line 53 extend parallel to each other, an edge in the width direction of the lower wiring line 53 may be located to overlap the upper wiring line 63 in the Z-axis direction. In such a case, the lower wiring line 53 and the upper wiring line 63 satisfy the intersecting positional relationship with each other.

The lower wiring lines 51 to 53 and the upper wiring lines 61 to 63 may each include a highly electrically-conductive nonmagnetic metal, such as aluminum (Al), copper (Cu), silver (Ag), gold (Au), or an alloy including any of these metals. The lower wiring lines 51 to 53 and the upper wiring lines 61 to 63 may each have a single-layer structure, or a multilayer structure including a plurality of layers. Respective constituent materials of the lower wiring lines 51 to 53 and the upper wiring lines 61 to 63 may be the same or different from each other.

The magnetoresistive effect films MR-A provided in the element formation region YZ1 may be coupled to each other in series to configure the magnetoresistive effect element 11 of the bridge circuit 7L. The magnetoresistive effect films MR-B provided in the element formation region YZ1 may be coupled to each other in series to configure the magnetoresistive effect element 21 of the bridge circuit 7R.

The magnetoresistive effect films MR-A provided in the element formation region YZ2 may be coupled to each other in series to configure the magnetoresistive effect element 12 of the bridge circuit 7L. The magnetoresistive effect films MR-B provided in the element formation region YZ2 may be coupled to each other in series to configure the magnetoresistive effect element 22 of the bridge circuit 7R.

The magnetoresistive effect films MR-A provided in the element formation region YZ3 may be coupled to each other in series to configure the magnetoresistive effect element 13 of the bridge circuit 7L. The magnetoresistive effect films MR-B provided in the element formation region YZ3 may be coupled to each other in series to configure the magnetoresistive effect element 23 of the bridge circuit 7R.

The magnetoresistive effect films MR-A provided in the element formation region YZ4 may be coupled to each other in series to configure the magnetoresistive effect element 14 of the bridge circuit 7L. The magnetoresistive effect films MR-B provided in the element formation region YZ4 may be coupled to each other in series to configure the magnetoresistive effect element 24 of the bridge circuit 7R.

It should be noted that combining the foregoing magnetic field detection apparatus 100 with a magnetic field detection unit (which will be referred to as a magnetic field detection unit 2C for convenience) that is configured to detect a change in a magnetic field in the X-axis direction makes it possible to implement a three-axis magnetic detection compass that detects changes in magnetic fields in three-axis directions. The magnetic field detection unit 2C applicable here may be one having substantially the same structure as that of the foregoing magnetic field detection apparatus 100 except that a plurality of magnetoresistive effect films is provided on a surface parallel to the flat surface 1S, for example.

Figure 5:
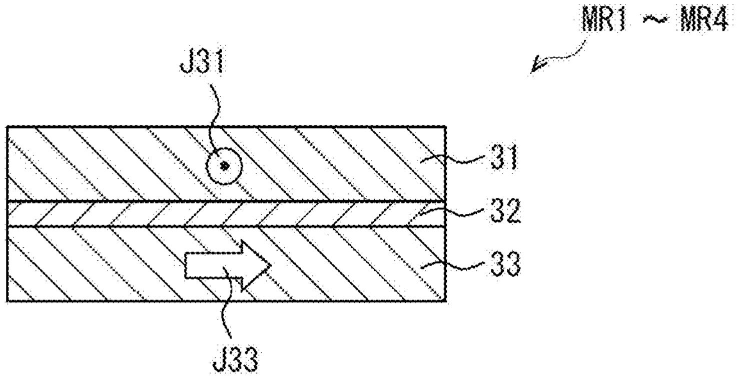
FIG. 5 is a schematic cross-sectional diagram illustrating a cross section of a stack structure of a magnetoresistive effect film illustrated in FIG. 3.

Here, the magnetoresistive effect films MR-A configuring the magnetoresistive effect element 11 and the magnetoresistive effect films MR-B configuring the magnetoresistive effect element 21, that is, the magnetoresistive effect films MR-A and the magnetoresistive effect films MR-B that are provided in the element formation region YZ1, will be collectively referred to as magnetoresistive effect films MR1. The magnetoresistive effect films MR-A configuring the magnetoresistive effect element 12 and the magnetoresistive effect films MR-B configuring the magnetoresistive effect element 22, that is, the magnetoresistive effect films MR-A and the magnetoresistive effect films MR-B that are provided in the element formation region YZ2, will be collectively referred to as magnetoresistive effect films MR2. The magnetoresistive effect films MR-A configuring the magnetoresistive effect element 13 and the magnetoresistive effect films MR-B configuring the magnetoresistive effect element 23, that is, the magnetoresistive effect films MR-A and the magnetoresistive effect films MR-B that are provided in the element formation region YZ3, will be collectively referred to as magnetoresistive effect films MR3. The magnetoresistive effect films MR-A configuring the magnetoresistive effect element 14 and the magnetoresistive effect films MR-B configuring the magnetoresistive effect element 24, that is, the magnetoresistive effect films MR-A and the magnetoresistive effect films MR-B that are provided in the element formation region YZ4, will be collectively referred to as magnetoresistive effect films MR4. FIG. 5 schematically illustrates a cross section of a stack structure of each of the magnetoresistive effect films MR1 to MR4.

As illustrated in FIG. 5, the magnetoresistive effect films MR1 to MR4 may each have a spin-valve structure including a plurality of stacked functional films including magnetic layers. In a specific but non-limiting example, the magnetoresistive effect films MR1 to MR4 may each have a stack structure in which a magnetization pinned layer 31, an intermediate layer 32, and a magnetization free layer 33 are stacked in order. The magnetization pinned layer 31 has a magnetization J31 pinned in a predetermined direction. The intermediate layer 32 may be a nonmagnetic body. The magnetization free layer 33 has a magnetization J33 whose orientation changes in accordance with the orientation of magnetic flux of the signal magnetic field. The magnetization pinned layer 31, the intermediate layer 32, and the magnetization free layer 33 may each be a thin film extending along the inclined surface 4A or 4B. The orientation of the magnetization J33 of the magnetization free layer 33 may be rotatable in a plane along the inclined surface 4A or 4B. As described above, the magnetoresistive effect films MR1 to MR4 may each extend in the V-axis direction. Thus, the magnetoresistive effect films MR1 to MR4 may each have a shape anisotropy in the V-axis direction. Accordingly, the magnetization J33 of the magnetization free layer 33 in an initial state may be oriented substantially parallel to the V-axis direction.

Figure 6:
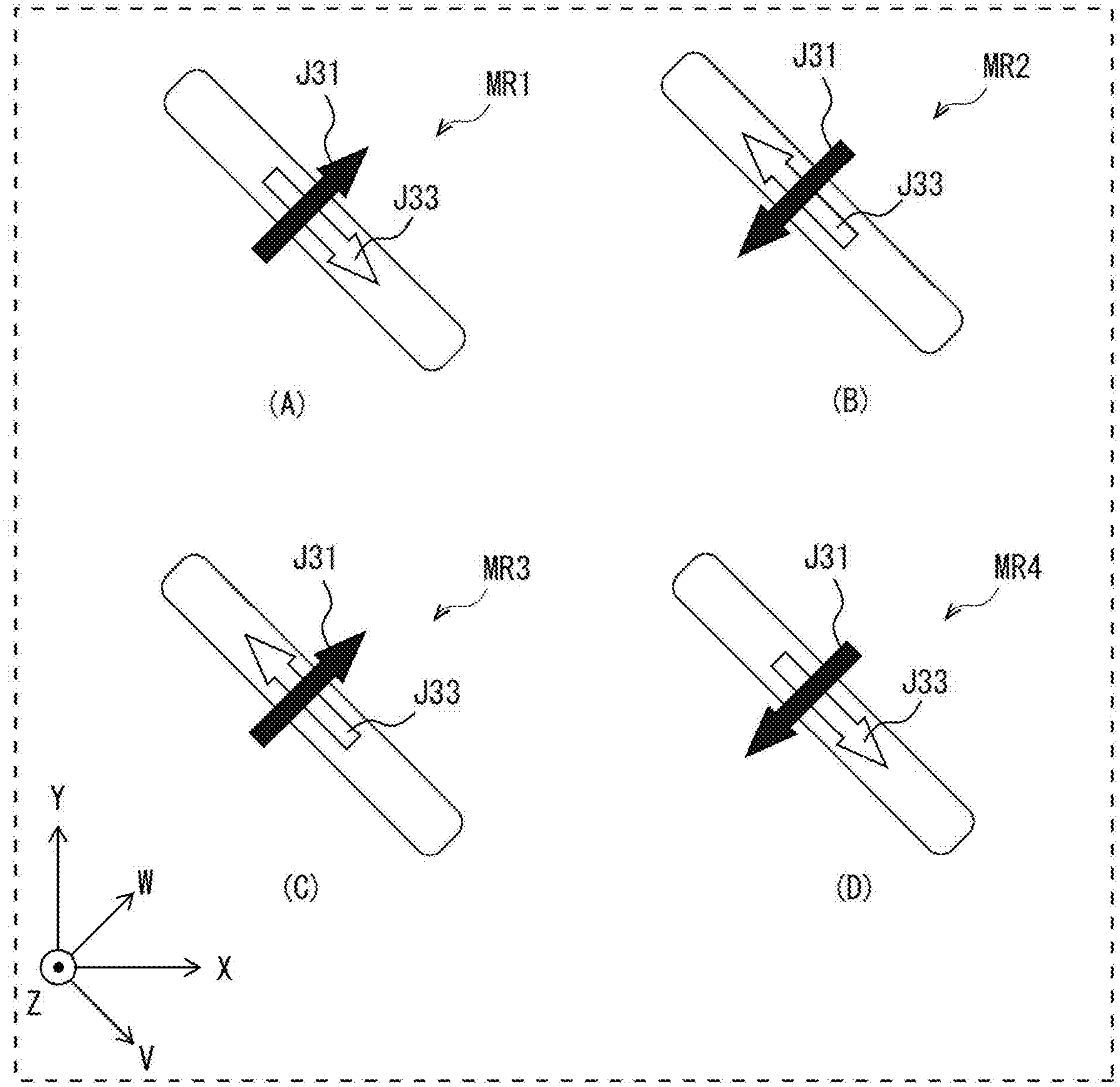
FIG. 6 is a schematic plan diagram for describing a relationship between respective magnetization directions of a magnetization pinned layer and a magnetization free layer illustrated in FIG. 5.

Pinning directions for the respective magnetizations J31 in the magnetoresistive effect films MR1 to MR4 may be set as illustrated in FIG. 6, for example. FIG. 6 is a schematic plan diagram for describing the relationship between the direction of the magnetization J31 of the magnetization pinned layer 31 and the direction of the magnetization J33 of the magnetization free layer 33 in the initial state. As illustrated in part (A) of FIG. 6, in the magnetoresistive effect films MR1, the magnetization J31 may be oriented in a +W direction and the magnetization J33 may be oriented in a +V direction, for example. As illustrated in part (B) of FIG. 6, in the magnetoresistive effect films MR2, the magnetization J31 may be oriented in a −W direction and the magnetization J33 may be oriented in a −V direction, for example. As illustrated in part (C) of FIG. 6, in the magnetoresistive effect films MR3, the magnetization J31 may be oriented in the +W direction and the magnetization J33 may be oriented in the −V direction, for example. As illustrated in part (D) of FIG. 6, in the magnetoresistive effect films MR4, the magnetization J31 may be oriented in the −W direction and the magnetization J33 may be oriented in the +V direction, for example.

Thus, the pinning directions for the respective magnetizations J31 in the magnetoresistive effect films MR1 to MR4 may be substantially parallel to the W-axis direction orthogonal to the V-axis direction. The sensitivity direction of the magnetoresistive effect films MR1 to MR4, that is, the direction in which the magnetoresistive effect films MR1 to MR4 exhibit high sensitivity to a signal magnetic field, may thus be the W-axis direction. However, the magnetization pinned layers 31 of the magnetoresistive effect films MR1 and MR3 each have the magnetization J31 pinned in the +W direction, whereas the magnetization pinned layers 31 of the magnetoresistive effect films MR2 and MR4 each have the magnetization J31 pinned in the −W direction. Accordingly, when the magnetoresistive effect films MR1 and MR3 each increase in resistance value in response to application of a signal magnetic field, the magnetoresistive effect films MR2 and MR4 each decrease in resistance value in response to the application of the signal magnetic field. Conversely, when the magnetoresistive effect films MR1 and MR3 each decrease in resistance value in response to application of a signal magnetic field, the magnetoresistive effect films MR2 and MR4 each increase in resistance value in response to the application of the signal magnetic field.

The magnetization pinned layers 31, the intermediate layers 32, and the magnetization free layers 33 configuring the magnetoresistive effect films MR1 to MR4 may each have a single-layer structure, or a multilayer structure including a plurality of layers.

The magnetization pinned layers 31 may each include a ferromagnetic material such as cobalt (Co), cobalt-iron alloy (CoFe), or cobalt-iron-boron alloy (CoFeB). Optionally, the magnetoresistive effect films MR1 to MR4 may each be provided with an antiferromagnetic layer (not illustrated) adjacent to the magnetization pinned layer 31 and located on the opposite side from the intermediate layer 32. The antiferromagnetic layer includes an antiferromagnetic material. Examples of the antiferromagnetic material may include platinum-manganese alloy (PtMn) and iridium-manganese alloy (IrMn). In each of the magnetoresistive effect films MR1 to MR4, the antiferromagnetic layer may be in a state in which a spin magnetic moment in the +W direction and a spin magnetic moment in the −W direction cancel each other out completely, and may act to pin the orientation of the magnetization J31 of the magnetization pinned layer 31 adjacent to the antiferromagnetic layer to the +W direction or to the −W direction.

In a case where the spin-valve structure serves as a magnetic tunnel junction (MTJ) film, the intermediate layer 32 serves as a nonmagnetic tunnel barrier layer which may include, for example, magnesium oxide (MgO), having a thickness small to the extent that a tunnel current based on quantum mechanics is able to pass therethrough. Note that the intermediate layer 32 may include a platinum group element such as ruthenium (Ru) or gold (Au), or a nonmagnetic metal such as copper (Cu). In such a case, the spin-valve structure serves as a giant magnetoresistive effect (GMR) film.

The magnetization free layers 33 may be soft ferromagnetic layers, and may include substantially the same material. The magnetization free layers 33 may include, for example, cobalt-iron alloy (CoFe), nickel-iron alloy (NiFe), or cobalt-iron-boron alloy (CoFeB). The magnetization free layers 33 may each have a magnetic vortex structure.

Operations and Workings of Magnetic Field Detection Apparatus 100

In the magnetic field detection apparatus 100 according to the present example embodiment, a change in a signal magnetic field applied to the magnetic field detection apparatus 100 is detectable at the calculation circuit 9 on the basis of the difference signal SL and the difference signal SR.

Setting and Resetting Operations

In the magnetic field detection apparatus 100, the magnetizations of the magnetization free layers in each magnetoresistive effect element may be temporarily aligned in a predetermined direction before performing an operation of detecting the signal magnetic field. One reason for this is that this serves to increase accuracy of the operation of detecting the signal magnetic field. In a specific but non-limiting example, an external magnetic field having a known magnitude may be applied in a predetermined direction and in a direction opposite thereto alternately. Such operations will be referred to as setting and resetting operations on the magnetizations J33 of the magnetization free layers 33.

In the magnetic field detection apparatus 100 according to the present example embodiment, the setting operation may be carried out by supplying the setting currents Is1 to Is4 to the conductors C1 to C4, respectively, as illustrated in FIG. 1. Supplying the setting currents Is1 to Is4 respectively to the conductors C1 to C4 generates respective setting magnetic fields around the conductors C1 to C4. As a result, in the magnetic field detection unit 2A, it is possible to apply the setting magnetic field in a −X direction to each of the magnetoresistive effect films MR1 of the magnetoresistive effect elements 11 and 21 and the magnetoresistive effect films MR4 of the magnetoresistive effect elements 14 and 24. This causes the magnetizations J33 of the magnetization free layers 33 in the magnetoresistive effect films MR1 and MR4 to be oriented in the −X direction. The setting operation on those magnetizations J33 is thus carried out. In the magnetic field detection unit 2B, it is possible to apply the setting magnetic field in a +X direction to each of the magnetoresistive effect films MR2 of the magnetoresistive effect elements 12 and 22 and the magnetoresistive effect films MR3 of the magnetoresistive effect elements 13 and 23. This causes the magnetizations J33 of the magnetization free layers 33 in the magnetoresistive effect films MR2 and MR3 to be oriented in the +X direction. The setting operation on those magnetizations J33 is thus carried out.

The resetting operation may be carried out by supplying the resetting currents Ir1 to Ir4 to the conductors C1 to C4, respectively. Supplying the resetting currents Ir1 to Ir4 respectively to the conductors C1 to C4 generates respective resetting magnetic fields around the conductors C1 to C4. As a result, in the magnetic field detection unit 2A, it is possible to apply the resetting magnetic field in the +X direction to each of the magnetoresistive effect films MR1 and MR4. This causes the magnetizations J33 of the magnetization free layers 33 in the magnetoresistive effect films MR1 and MR4 to be oriented in the +X direction. The resetting operation on those magnetizations J33 is thus carried out. In the magnetic field detection unit 2B, it is possible to apply the resetting magnetic field in the −X direction to each of the magnetoresistive effect films MR2 and MR3. This causes the magnetizations J33 of the magnetization free layers 33 in the magnetoresistive effect films MR2 and MR3 to be oriented in the −X direction. The resetting operation on those magnetizations J33 is thus carried out.

Method of Manufacturing Magnetic Field Detection Apparatus 100

Next, a method of manufacturing the magnetic field detection apparatus 100 will be described with reference to FIGS. 7A to 7I. FIGS. 7A to 7I are schematic cross-sectional diagrams each illustrating a step of a manufacturing process of the lower wiring line group 5, the magnetoresistive effect films MR-A and MR-B, and the upper wiring line group 6, among components of the magnetic field detection apparatus 100.

Figure 7A:
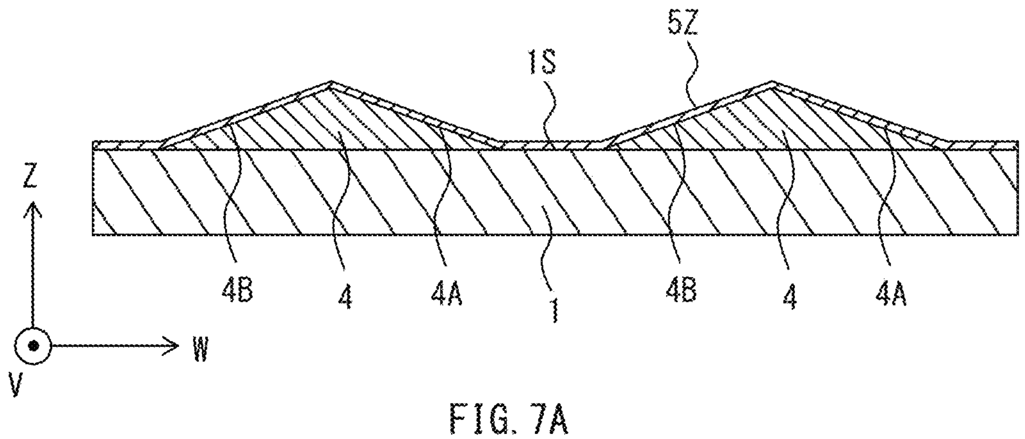
FIG. 7A is a schematic cross-sectional diagram illustrating a step of a method of manufacturing the magnetic field detection apparatus illustrated in FIG. 1.

First, after the substrate 1 is prepared, as illustrated in FIG. 7A, the projections 4 each extending in the V-axis direction may be so formed on the flat surface 1S as to be arranged in the W-axis direction. Thereafter, an electrically-conductive material film 5Z may be formed to entirely cover the substrate 1 and the projections 4.

Figure 7B:
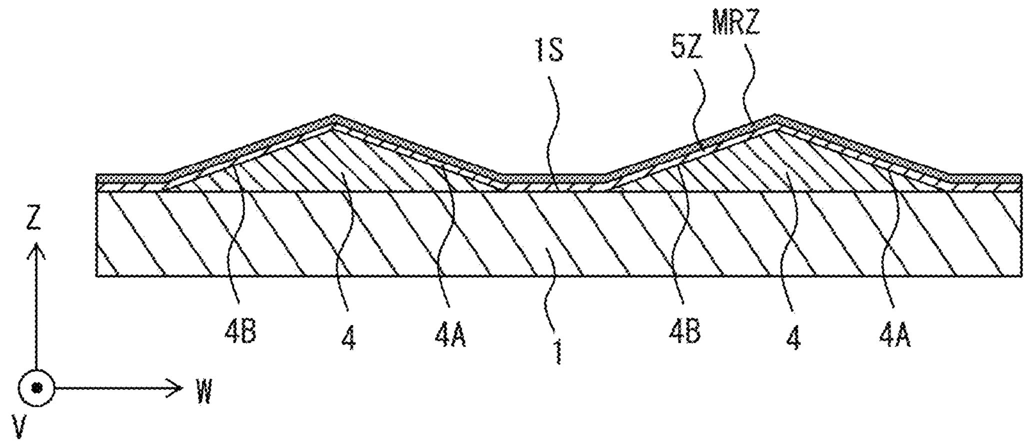
FIG. 7B is a schematic cross-sectional diagram illustrating a step that follows the step of FIG. 7A.

Next, as illustrated in FIG. 7B, a magnetoresistive effect film MRZ may be formed to cover the electrically-conductive material film 5Z.

Figure 7C:
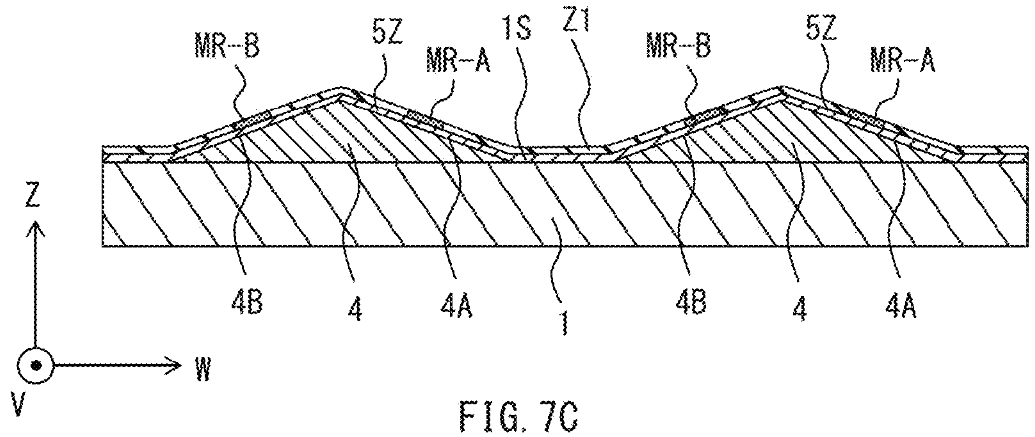
FIG. 7C is a schematic cross-sectional diagram illustrating a step that follows the step of FIG. 7B.

Next, as illustrated in FIG. 7C, the magnetoresistive effect film MRZ may be selectively etched by, for example, photolithography to thereby form the magnetoresistive effect films MR-A and MR-B having a predetermined shape. Thereafter, an insulating film Z1 may be formed to fill a space around each of the magnetoresistive effect films MR-A and MR-B.

Figure 7D:
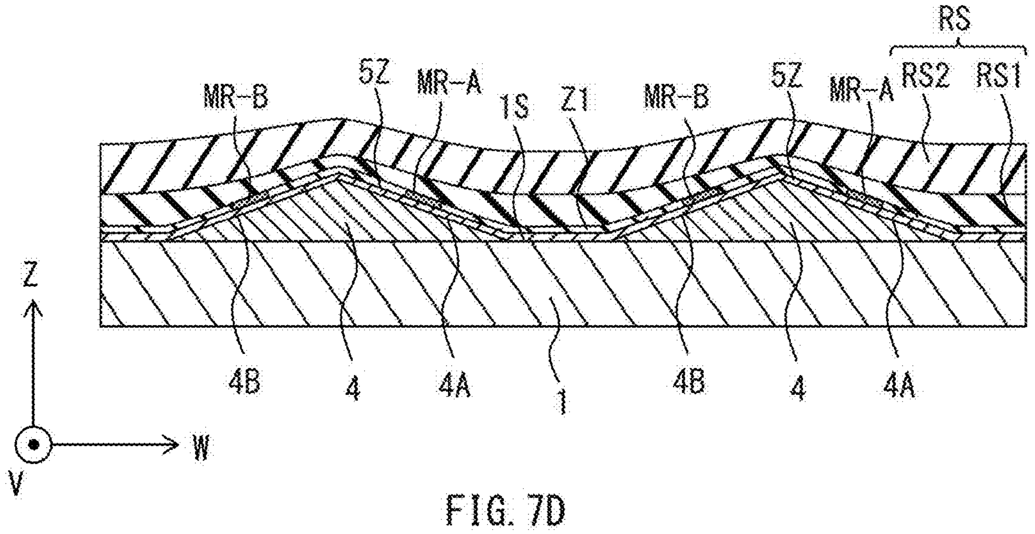
FIG. 7D is a schematic cross-sectional diagram illustrating a step that follows the step of FIG. 7C.

Next, as illustrated in FIG. 7D, a first resist layer RS1 and a second resist layer RS2 may be stacked in this order to cover the magnetoresistive effect films MR-A and MR-B and the insulating layer Z1. A two-layer resist RS may thus be formed.

Figure 7E:
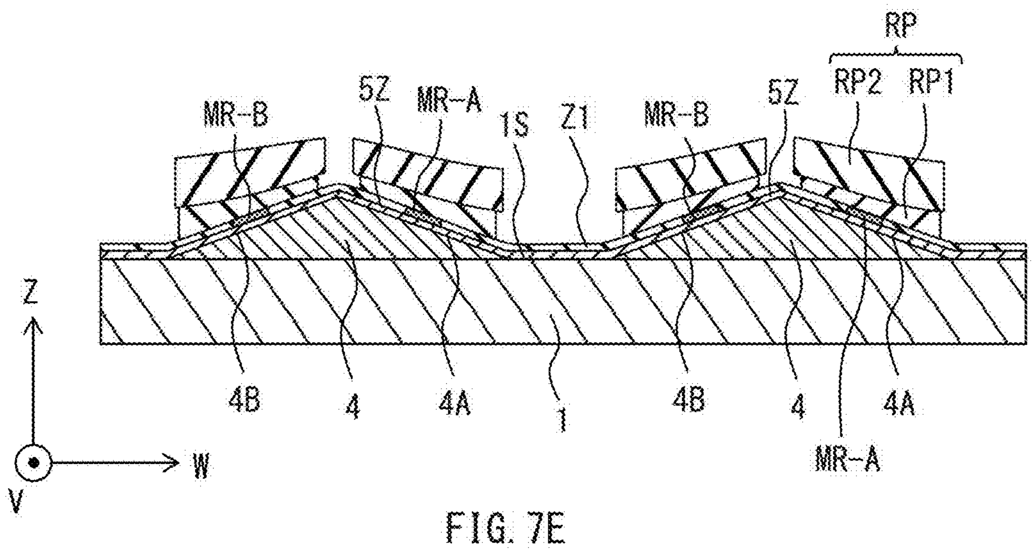
FIG. 7E is a schematic cross-sectional diagram illustrating a step that follows the step of FIG. 7D.

Next, as illustrated in FIG. 7E, the two-layer resist RS may be selectively exposed to light, following which the exposed portion of the two-layer resist RS may be removed with a developer. A two-layer resist pattern RP may thus be formed that selectively covers the electrically-conductive material film 5Z. The two-layer resist pattern RP may have a two-layer structure including a first resist pattern RP1 and a second resist pattern RP2.

Figure 7F:
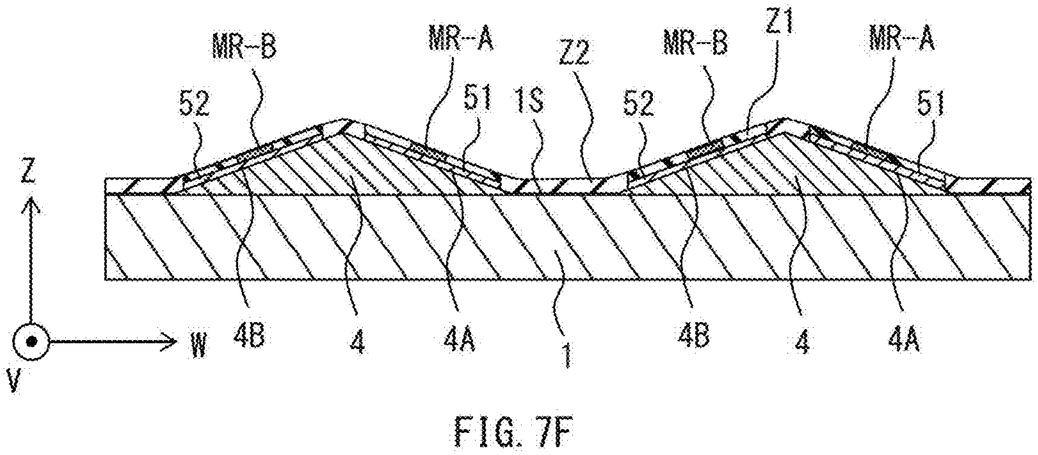
FIG. 7F is a schematic cross-sectional diagram illustrating a step that follows the step of FIG. 7E.

Next, as illustrated in FIG. 7F, the insulating film Z1 and the electrically-conductive material film 5Z may be selectively etched using the two-layer resist pattern RP as a mask. For example, portions of the insulating film Z1 and the electrically-conductive material film 5Z that are not covered with the two-layer resist pattern RP may be removed. The lower wiring line group 5 may thus be formed on the inclined surfaces 4A and 4B of each of the projections 4. Referring to a cross section illustrated in FIG. 7F, the lower wiring lines 51 may be formed on the respective inclined surfaces 4A of the projections 4, and the lower wiring lines 52 may be formed on the respective inclined surfaces 4B of the projections 4. Thereafter, an insulating film Z2 may be formed to fill a space resulting from the removal of the insulating film Z1 and the electrically-conductive material film 5Z, and the two-layer resist pattern RP may be lifted off.

Figure 7G:
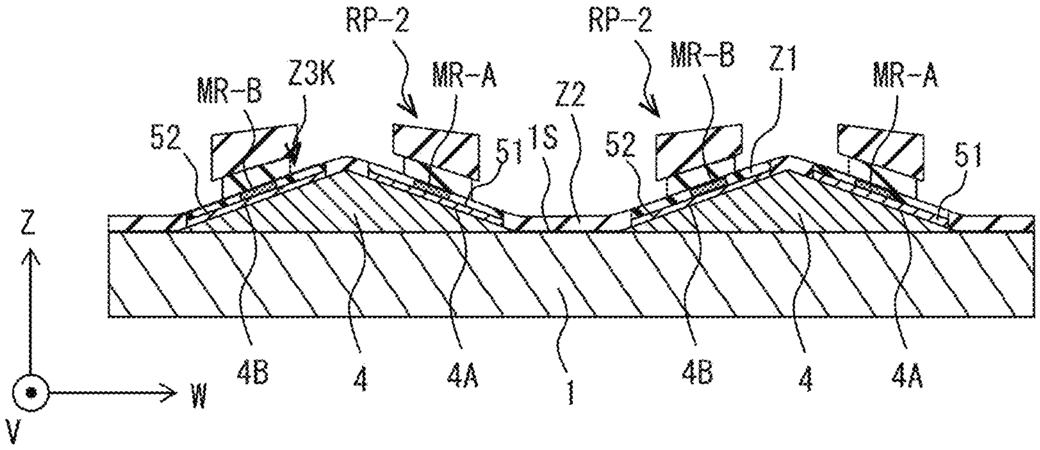
FIG. 7G is a schematic cross-sectional diagram illustrating a step that follows the step of FIG. 7F.

Next, as illustrated in FIG. 7G, a two-layer resist pattern RP-2 may be formed on the magnetoresistive effect films MR-A and MR-B. At that time, each pattern unit of the two-layer resist pattern RP-2 may be set to a smaller width in the W-axis direction than a width in the W-axis direction of each of the lower wiring lines 51 and 52.

Figure 7H:
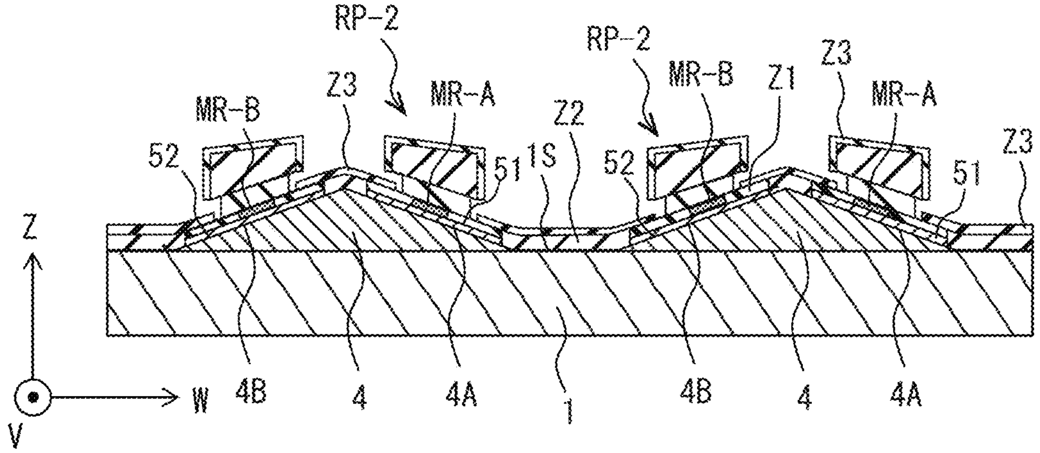
FIG. 7H is a schematic cross-sectional diagram illustrating a step that follows the step of FIG. 7G.

Next, as illustrated in FIG. 7H, an insulating film Z3 may be formed to entirely cover the two-layer resist pattern RP-2, the insulating film Z1, and the insulating film Z2.

Figure 7I:
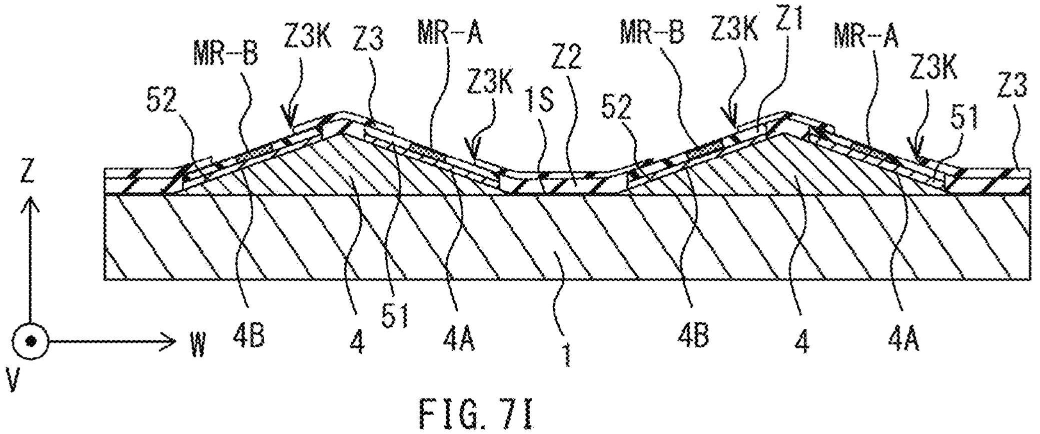
FIG. 7I is a schematic cross-sectional diagram illustrating a step that follows the step of FIG. 7H.

Next, the two-layer resist pattern RP-2 may be removed. This causes a plurality of openings Z3K to appear in the insulating film Z3 as illustrated in FIG. 7I. The top surfaces of the magnetoresistive effect films MR-A and MR-B may be exposed at the openings Z3K.

Figure 7J:
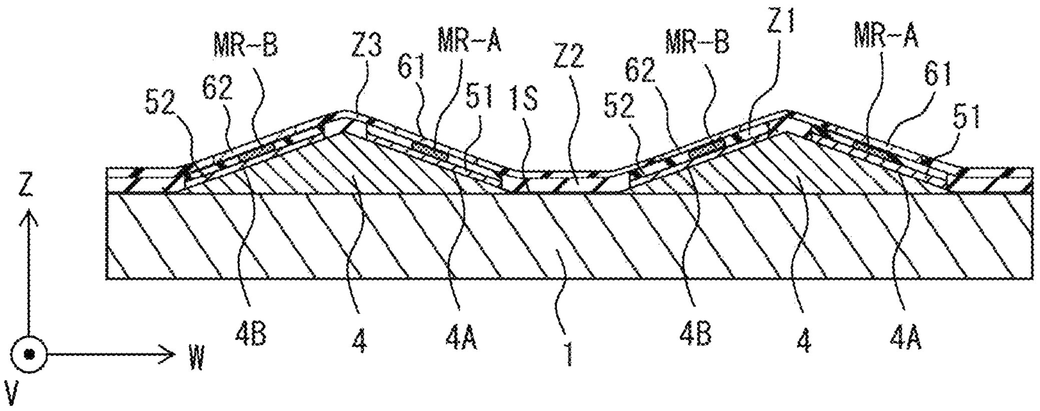
FIG. 7J is a schematic cross-sectional diagram illustrating a step that follows the step of FIG. 7I.
Figure 7K:
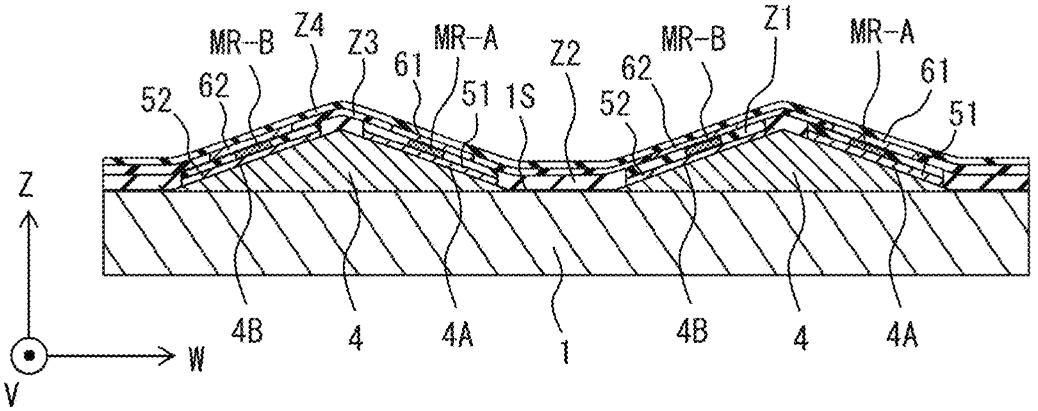
FIG. 7K is a schematic cross-sectional diagram illustrating a step that follows the step of FIG. 7J.

Thereafter, as illustrated in FIG. 7J, the upper wiring line group 6 (in FIG. 7J, the upper wiring lines 61 and 62 of the upper wiring line group 6 are illustrated) may be formed to fill the openings Z3K provided in the insulating film Z3. Lastly, as illustrated in FIG. 7K, an insulating film Z4 may be formed to entirely cover the insulating film Z3 and the upper wiring line group 6, for example. The manufacture of the magnetic field detection apparatus 100 may thus end.

Example Effects of Magnetic Field Detection Apparatus 100

As described above, in the magnetic field detection apparatus 100 according to the present example embodiment, the lower wiring line 53 and the upper wiring line 63 intersect on the inclined surface 4A, the inclined surface 4B, or both, not intersecting on the flat surface 1S. Thus, as illustrated in FIG. 3, the cross point XP may be present on the inclined surface 4A, the inclined surface 4B, or both, and not on the flat surface 1S. This helps to reduce a possibility of occurrence of a short circuit between the lower wiring line 53 and the upper wiring line 63. One reason for this is that, as will be described below, the lower wiring line 53 formed on the flat surface 1S is prone to burr generation, whereas the lower wiring line 53 formed on the inclined surface 4A or 4B resists burr generation. Accordingly, allowing the upper wiring line 63 to intersect the lower wiring line 53 formed on the inclined surface 4A or 4B and not to intersect the lower wiring line 53 formed on the flat surface 1S helps to prevent the lower wiring line 53 and the upper wiring line 63 from unintentionally becoming electrically continuous with each other via burrs present on the lower wiring line 53.

Figure 8:
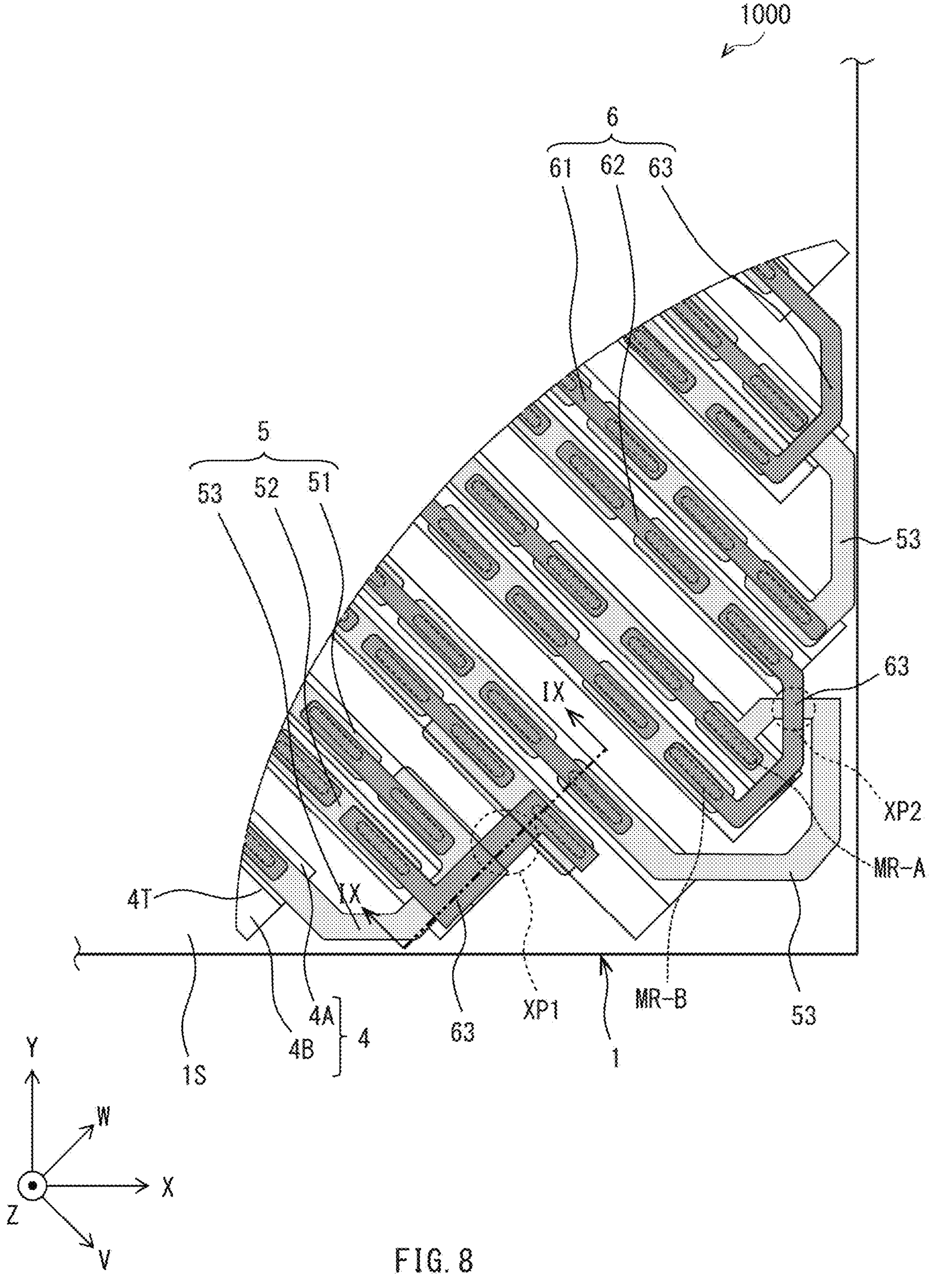
FIG. 8 is a schematic plan diagram illustrating a plan configuration of an element formation region of a magnetic field detection apparatus according to a reference example.
Figure 9A:
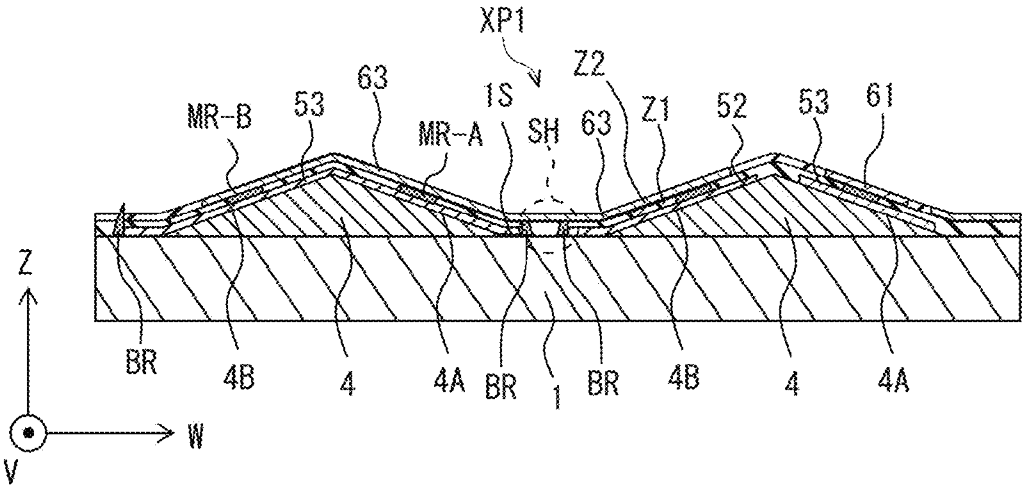
FIG. 9A is a schematic cross-sectional diagram illustrating a cross-sectional configuration of the element formation region illustrated in FIG. 8.
Figure 9B:
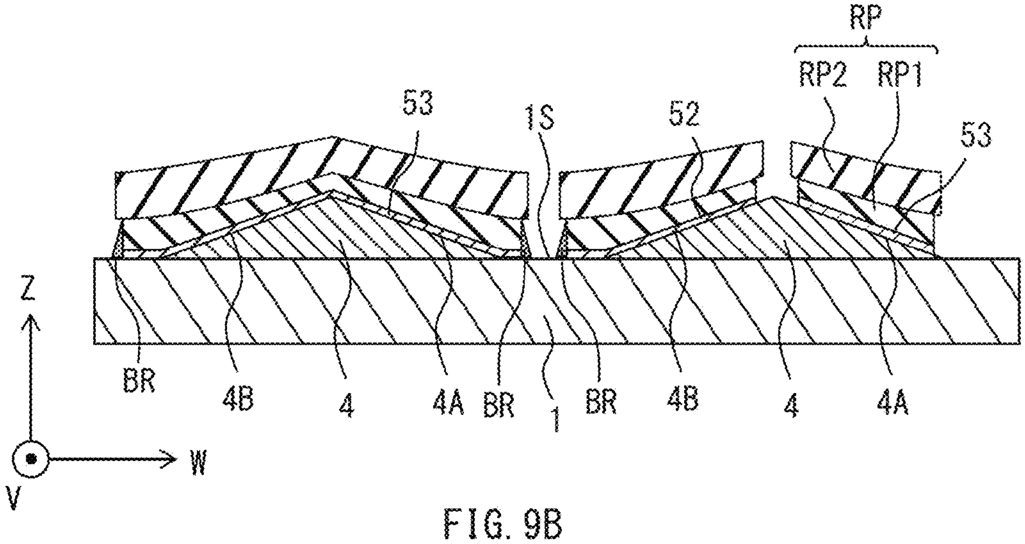
FIG. 9B is a schematic cross-sectional diagram illustrating a step of a method of manufacturing the magnetic field detection apparatus illustrated in FIG. 8.

FIG. 8 is a plan diagram schematically illustrating an element formation region of a magnetic field detection apparatus 1000 according to a reference example. FIG. 8 corresponds to FIG. 3 of the present example embodiment. As illustrated in FIG. 8, the magnetic field detection apparatus 1000 according to the reference example has cross points XP1 and XP2 formed on the flat surface 1S of the substrate 1. FIG. 9A is a schematic cross-sectional diagram illustrating a cross section taken along line IX-IX in FIG. 8 as viewed in the arrowed direction. As illustrated in FIG. 9A, at the cross point XP1, there is a short circuit portion SH generated via burrs BR. The burrs BR lie at respective ends of the lower wiring lines 52 and 53 on the flat surface 1S. The burrs BR are ones occurring in patterning the lower wiring lines 52 and 53. FIG. 9B is a schematic cross-sectional diagram illustrating a step of a method of manufacturing the magnetic field detection apparatus 1000, and illustrates a state immediately after the lower wiring lines 52 and 53 have been selectively etched, in particular. The lower wiring lines 52 and 53 of the magnetic field detection apparatus 1000 according to the reference example are patterned by selectively etching an electrically-conductive material film using the two-layer resist pattern RP as a mask, as with the lower wiring line group 5 of the magnetic field detection apparatus 100 according to the present example embodiment. However, in the magnetic field detection apparatus 1000 according to the reference example, the lower wiring lines 52 and 53 extend not only to cover the inclined surfaces 4A and 4B but also to partly cover the flat surface 1S. In general, it is often the case that a thickness of a resist pattern adhering to a flat surface becomes greater than a thickness of the resist pattern adhering to an inclined surface. Thus, as illustrated in FIG. 9B, the first resist pattern RP1 often has a greater thickness on the flat surface 1S than on each of the inclined surfaces 4A and 4B. If the electrically-conductive material film is selectively etched using the two-layer resist pattern RP including such a first resist pattern RP1, as illustrated in FIG. 9B, the electrically-conductive material film having been removed will redeposit on end faces of the first resist pattern RP1, resulting in the burrs BR in contact with the end faces of the lower wiring lines 52 and 53. The burrs BR will often remain as residues on the flat surface 1S even after the two-layer resist pattern RP is lifted off. If the upper wiring line 63 is formed thereafter, the burrs BR and the upper wiring line 63 come into contact with each other. Because the burrs BR are also in contact with the end faces of the lower wiring lines 52 and 53, electrical continuity between the upper wiring line 63 and the lower wiring lines 52 and 53 will result.

In contrast, the magnetic field detection apparatus 100 according to the present example embodiment has no cross point XP on the flat surface 1S. Accordingly, even if the burrs BR are generated, no upper wiring line group 6 is located to overlap the burrs BR in the Z-axis direction. This makes it possible to prevent a short circuit between the lower wiring line group 5 and the upper wiring line group 6.

For some reasons described above, the magnetic field detection apparatus 100 makes it possible to increase a density of the magnetoresistive effect elements per unit area while suppressing the occurrence of a short circuit. Accordingly, the magnetic field detection apparatus 100 is able to achieve reduction in size without loss of operational reliability.

2. MODIFICATION EXAMPLES

The disclosure has been described above with reference to one example embodiment. However, the disclosure is not limited thereto, and may be modified in a variety of ways. For example, in the foregoing example embodiment, four magnetoresistive effect elements may be used to form a full-bridge circuit. However, in some embodiments of the disclosure, two magnetoresistive effect elements may be used to form a half-bridge circuit, for example. Further, the magnetoresistive effect films may be identical with each other or different from each other in shape and dimensions. The dimensions of components and the layouts of the components are merely illustrative and non-limiting.

First Modification Example

Figure 10:
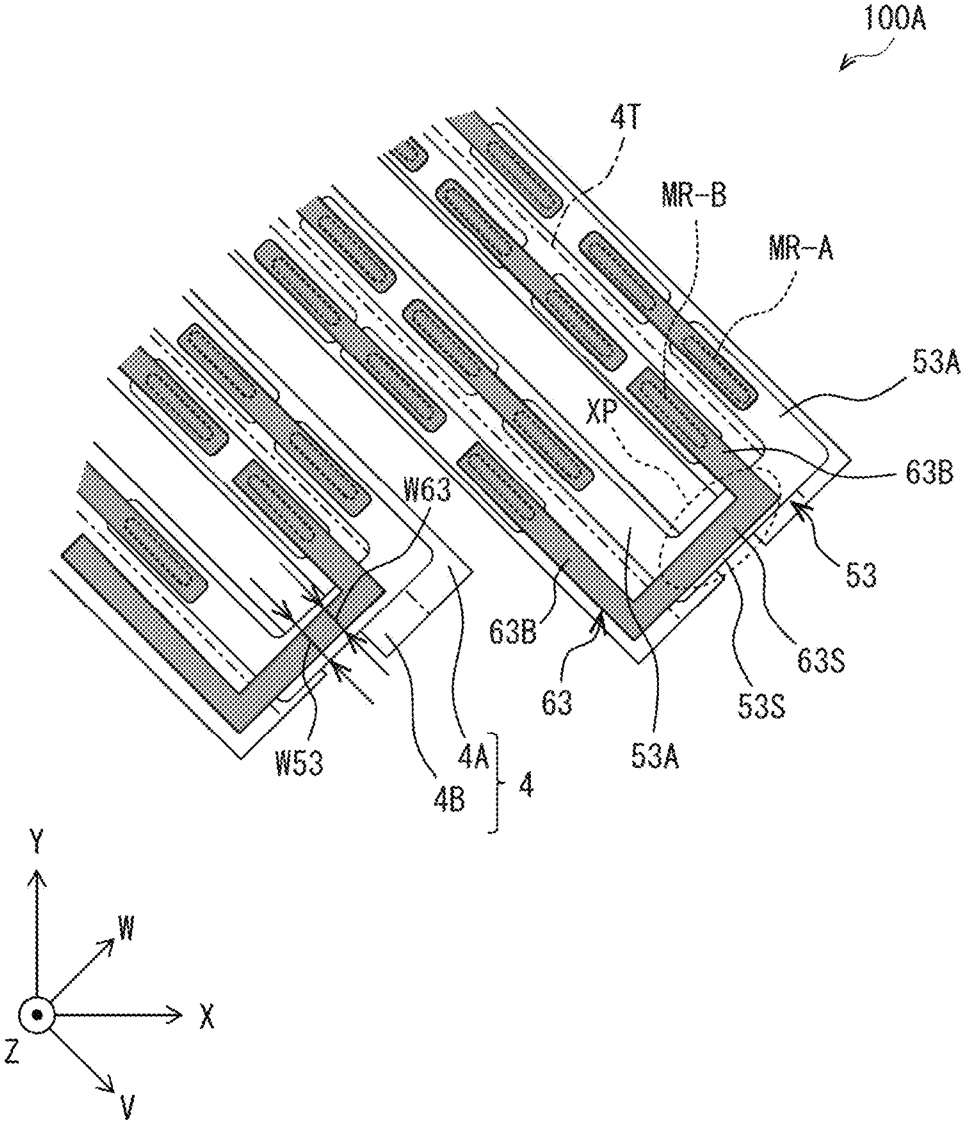
FIG. 10 is a schematic plan diagram illustrating a configuration example of a portion of a magnetic field detection apparatus according to a first modification example of one example embodiment of the disclosure.

In the foregoing example embodiment, as illustrated in FIG. 3, for example, regions where the upper wiring line group 6 and the lower wiring line group 5 overlap each other in the Z-axis direction may be provided only on the inclined surfaces 4A and 4B of the projections 4. However, concepts of the disclosure include also a magnetic field detection apparatus 100A according to a first modification example illustrated in FIG. 10, for example. FIG. 10 is a schematic plan view of a portion of the magnetic field detection apparatus 100A according to the first modification example of the foregoing example embodiment of the disclosure. In the magnetic field detection apparatus 100A illustrated in FIG. 10, regions where the upper wiring line 63 and the lower wiring line 53 overlap each other in the Z-axis direction may be provided on regions of the flat surface 1S on which no projections 4 are formed. Note that, on the flat surface 1S of the magnetic field detection apparatus 100A, the upper wiring line 63 and the lower wiring line 53 may extend in parallel in substantially the same direction (e.g., in the W-axis direction), not intersecting each other. Thus, the upper wiring line 63 may include a flat part 63S provided on the flat surface 1S and extending in the W-axis direction, and the lower wiring line 53 may include a flat part 53S provided on the flat surface 1S and extending in the W-axis direction. In the magnetic field detection apparatus 100A illustrated in FIG. 10, the flat part 53S may be coupled to a part 53A into a substantially L-shape in a plan view, the part 53A being a portion of the lower wiring line 53 provided on the inclined surface 4A. Likewise, the flat part 63S may be coupled to a part 63B into a substantially L-shape in a plan view, the part 63B being a portion of the upper wiring line 63 provided on the inclined surface 4B. The flat part 53S of the lower wiring line 53 may be provided between the flat part 63S of the upper wiring line 63 and the flat surface 1S to overlap the flat part 63S and the flat surface 1S in the Z-axis direction. In addition, a width W53 in the V-axis direction of the flat part 53S may be greater than a width W63 in the V-axis direction of the flat part 63S overlapping the flat part 53S in the Z-axis direction, and opposite edges in the V-axis direction of the flat part 63S may be located on an inner side relative to the opposite edges in the V-axis direction of the flat part 53S. This allows no portion of the upper wiring line 63 to be located to overlap, in the Z-axis direction, the opposite edges of the lower wiring line 53. Accordingly, even if burrs are generated at the opposite edges of the flat part 53S of the lower wiring line 53, it is possible to prevent a short circuit between the upper wiring line 63 and the lower wiring line 53 from occurring via such burrs. It is thus possible to achieve an effect according to some embodiments of the disclosure. Further, in the magnetic field detection apparatus 100A, the inclined surfaces 4A and 4B may both be inclined in the W-axis direction in which the flat part 53S of the lower wiring line 53 and the flat part 63S of the upper wiring line 63 provided on the flat surface 1S extend. This allows more efficient use of a limited area to lay out the lower wiring line 53 and the upper wiring line 63 than in a case where the flat part 53S of the lower wiring line 53 and the flat part 63S of the upper wiring line 63 extend in an oblique direction, e.g., in a direction different from both the W-axis direction and the V-axis direction. This contributes to reduction in size of the magnetic field detection apparatus 100A. Further, the efficient layout of the lower wiring line 53 and the upper wiring line 63 is expected to result in a reduction in length of each of the lower wiring line 53 and the upper wiring line 63. Furthermore, it is possible to reduce adhesion of a redeposit resulting from the etching process in forming the lower wiring lines 51 to 53 on the inclined surfaces 4A and 4B extending in the V-axis direction. The W-axis direction may correspond to a specific but non-limiting example of a "first direction" according to one embodiment of the disclosure, and the V-axis direction may correspond to a specific but non-limiting example of a "second direction" according to one embodiment of the disclosure. In addition, the flat part 53S may correspond to a specific but non-limiting example of a "first flat part" according to one embodiment of the disclosure, and the flat part 63S may correspond to a specific but non-limiting example of a "second flat part" according to one embodiment of the disclosure. Further, the part 53A may correspond to a specific but non-limiting example of a "first inclined part" according to one embodiment of the disclosure.

Second Modification Example

Figure 11:
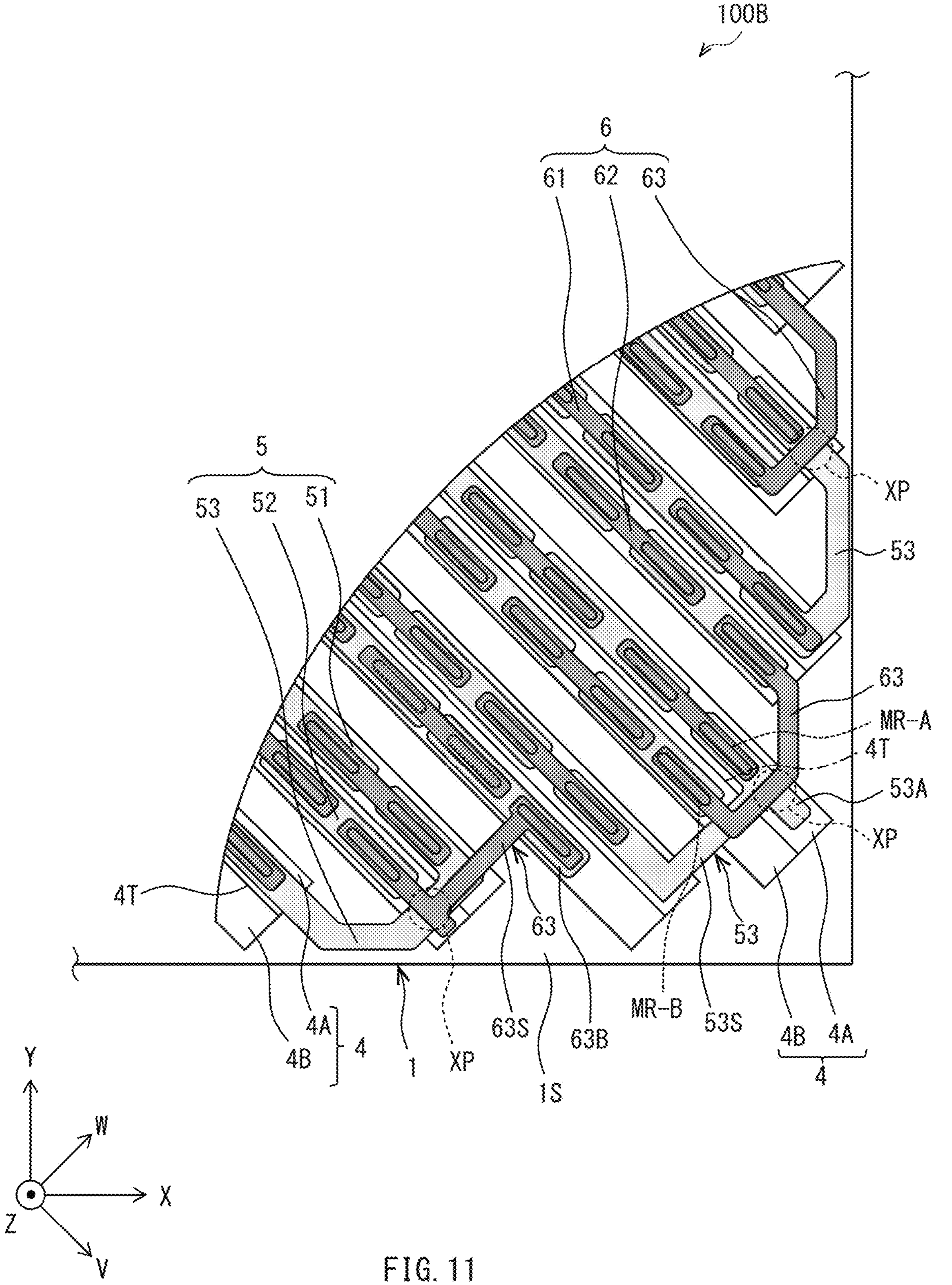
FIG. 11 is a schematic plan diagram illustrating a configuration example of a portion of a magnetic field detection apparatus according to a second modification example of one example embodiment of the disclosure.

In the magnetic field detection apparatus 100A according to the first modification example illustrated in FIG. 10, the flat part 53S and the flat part 63S may overlap each other; however, the disclosure is not limited thereto. FIG. 11 illustrates a magnetic field detection apparatus 100B according to a second modification example. As illustrated, for example, the flat part 53S and the flat part 63S provided on the flat surface 1S may extend in the W-axis direction at respective locations that do not overlap each other. Further, in the magnetic field detection apparatus 100A illustrated in FIG. 10, the flat part 53S may be coupled to the part 53A of the lower wiring line 53 provided on the inclined surface 4A into a substantially L-shape in a plan view; however, the disclosure is not limited thereto. As illustrated in FIG. 11, the flat part 53S may be coupled to the part 53A of the lower wiring line 53 provided on the inclined surface 4A into a substantially T-shape in a plan view. Likewise, in the magnetic field detection apparatus 100A illustrated in FIG. 10, the flat part 63S may be coupled to the part 63B of the upper wiring line 63 provided on the inclined surface 4B into a substantially L-shape in a plan view; however, the disclosure is not limited thereto. As illustrated in FIG. 11, the flat part 63S may be coupled to the part 63B of the upper wiring line 63 provided on the inclined surface 4B into a substantially T-shape in a plan view. FIG. 11 is a schematic plan view of a portion of the magnetic field detection apparatus 100B according to the second modification example of the foregoing example embodiment of the disclosure. The magnetic field detection apparatus 100B of FIG. 11 having the above-described configuration allows efficient layout of the lower wiring line 53 and the upper wiring line 63. This is expected to result in a reduction in length of each of the lower wiring line 53 and the upper wiring line 63. Unlike the magnetic field detection apparatus 100A illustrated in FIG. 10, the magnetic field detection apparatus 100B of FIG. 11 makes it possible to couple the flat part 53S to a middle portion of the part 53A provided on the inclined surface 4A, the middle portion being other than end portions of the part 53A in an extending direction thereof (the V-axis direction). Further, the magnetic field detection apparatus 100B of FIG. 11 makes it possible to couple the flat part 63S to a middle portion of the part 63B provided on the inclined surface 4B, the middle portion being other than end portions of the part 63B in an extending direction thereof (the V-axis direction). This allows further improvement in layout flexibility for the lower wiring line group 5 and the upper wiring line group 6, and furthermore, has an advantage in reducing wiring resistance, as compared with a case with the magnetic field detection apparatus 100A illustrated in FIG. 10. Moreover, the magnetic field detection apparatus 100B of FIG. 11 makes it possible to reduce adhesion of the redeposit resulting from the etching process in forming the lower wiring lines 51 to 53 on the inclined surfaces 4A and 4B extending in the V-axis direction. Here, the extending direction of the flat part 53S may be substantially orthogonal to the extending direction of the part 53A. One reason for this is that, in such a case, it is possible to further reduce the amount of adhesion of the redeposit as compared with a case where the extending direction of the flat part 53S is inclined (at an angle greater than 0° and less than 90°) with respect to the extending direction of the part 53A. This makes it possible to sufficiently reduce the possibility of unintentional electrical continuity between the lower wiring line 53 and the upper wiring line 63.

Third Modification Example

Figure 12:
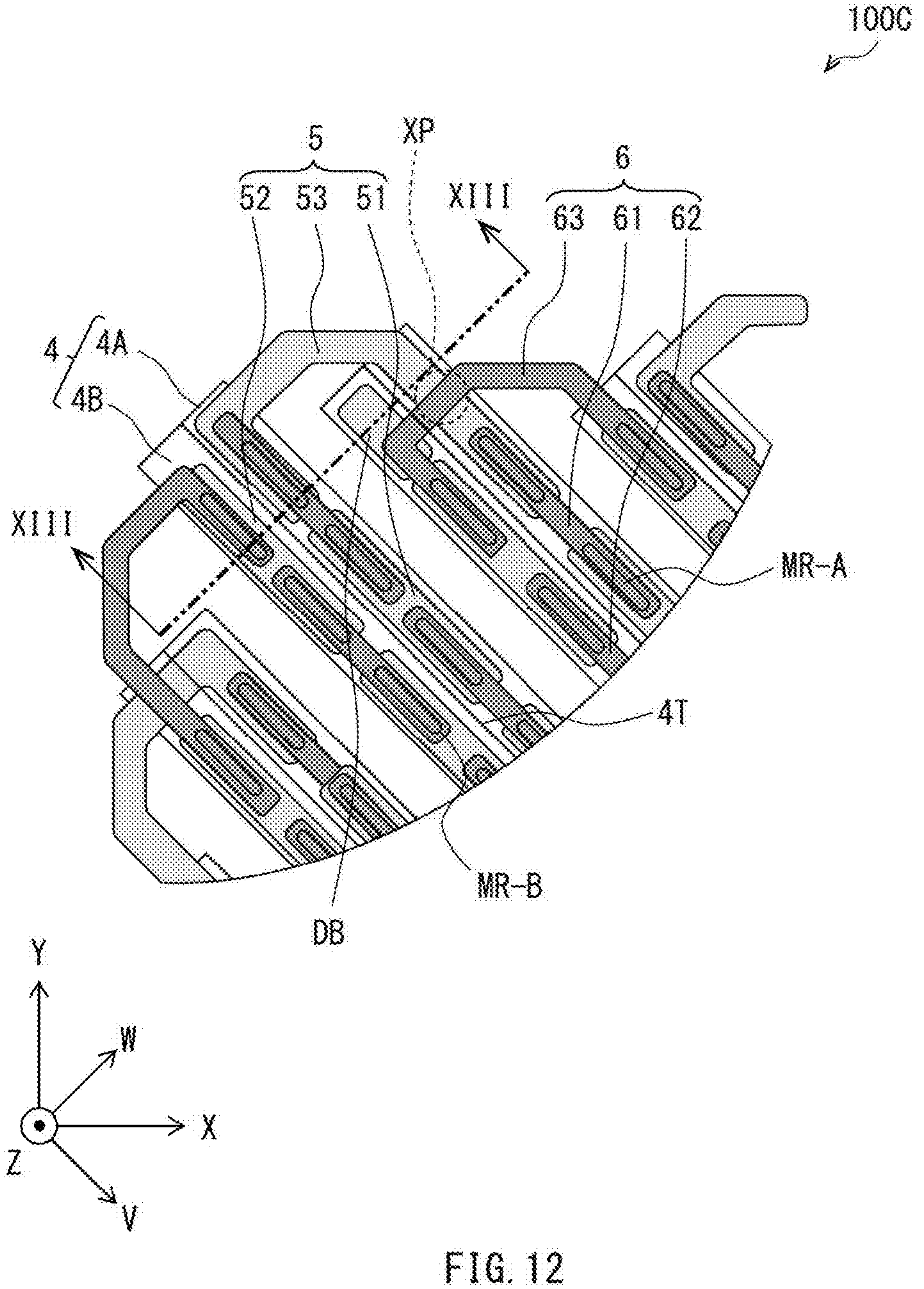
FIG. 12 is a schematic plan diagram illustrating a configuration example of a portion of a magnetic field detection apparatus according to a third modification example of one example embodiment of the disclosure.
Figure 13:
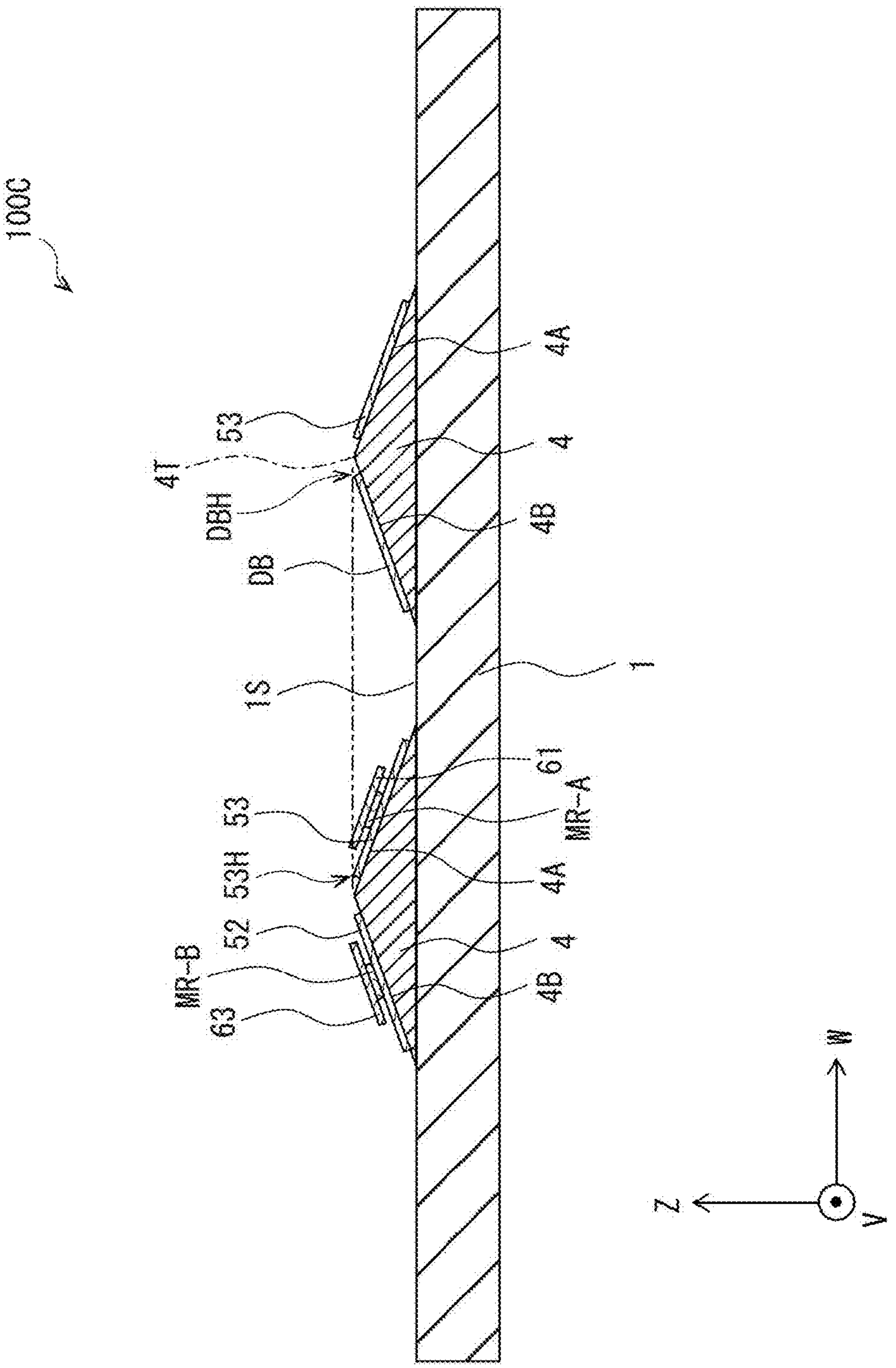
FIG. 13 is a schematic cross-sectional diagram illustrating a configuration example of a portion of the magnetic field detection apparatus according to the third modification example illustrated in FIG. 12.

In the magnetic field detection apparatus 100 according to the present example embodiment illustrated in FIG. 3, the lower wiring line group 5 and the upper wiring line group 6 may be conductors that electrically couple the magnetoresistive effect films MR-A and MR-B to each other. However, the disclosure is not limited thereto. FIGS. 12 and 13 illustrate a magnetic field detection apparatus 100C according to a third modification example. As illustrated, for example, one or more dummy patterns DB may be provided on the inclined surface 4B. FIG. 12 is a schematic plan view of a portion of the magnetic field detection apparatus 100C according to the third modification example of the foregoing example embodiment of the disclosure. FIG. 13 illustrates a cross section taken along line XIII-XIII in FIG. 12 as viewed in the arrowed direction. Providing the one or more dummy patterns DB on the inclined surface 4B as illustrated in FIGS. 12 and 13 makes it possible to suppress the generation of burrs at the edges of the lower wiring lines 51 and 53 in forming the lower wiring lines 51 and 53 on the inclined surfaces 4A adjacent to each other and opposed to each other across the flat surface 1S in the W-axis direction, or makes it possible to reduce the size of burrs even if the burrs are generated.

Figure 14A:
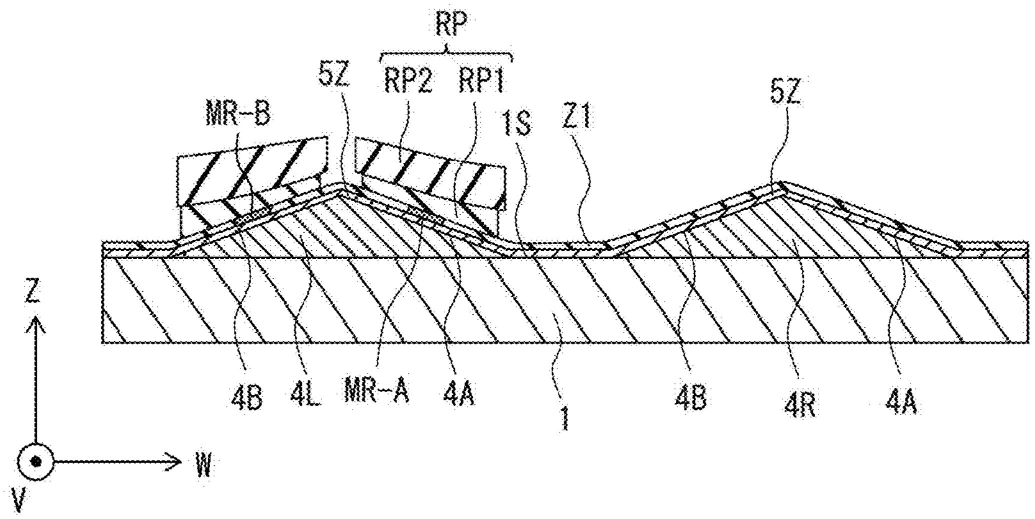
FIG. 14A is a first explanatory diagram for describing workings and example effects of the magnetic field detection apparatus according to the third modification example illustrated in FIG. 12.
Figure 14B:
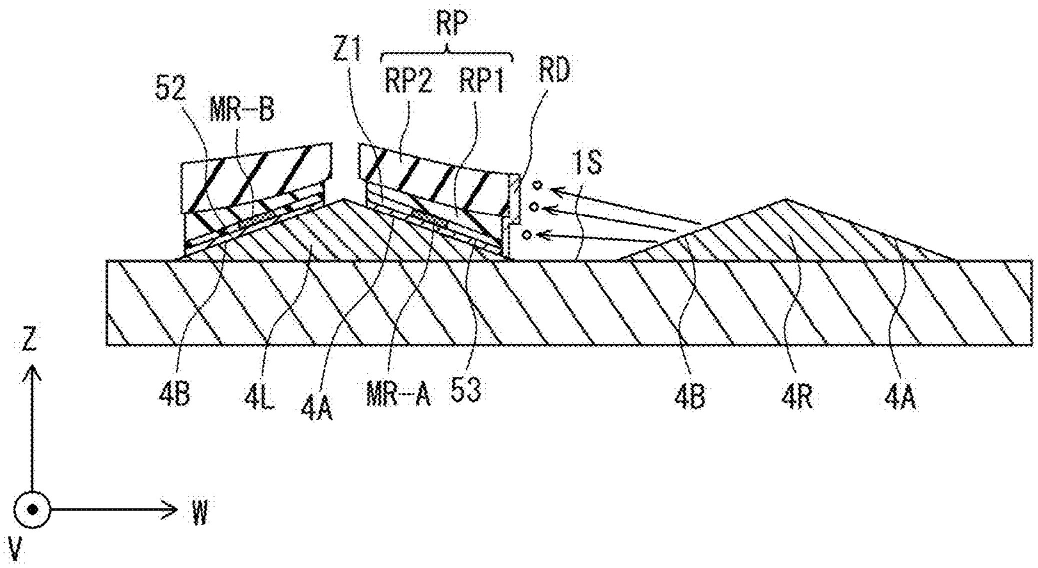
FIG. 14B is a second explanatory diagram for describing the workings and the example effects of the magnetic field detection apparatus according to the third modification example illustrated in FIG. 12.

Now, a description will be given of a case of forming no lower wiring line or no dummy pattern on the inclined surface 4B, of the inclined surfaces 4A and 4B adjacent to each other and opposed to each other across the flat surface 1S in the W-axis direction, while forming the lower wiring line 53 on the inclined surface 4A, as illustrated in FIGS. 14A and 14B as a reference example. For example, a description will be given of a case where, as illustrated in FIGS. 14A and 14B, the lower wiring line 53 and the magnetoresistive effect film MR-A are formed on the inclined surface 4A of a projection 4L on the left side of the drawing sheet, which is one of two projections 4L and 4R adjacent to each other in the W-axis direction, whereas no lower wiring line or no magnetoresistive effect film is formed on the inclined surface 4B of the projection 4R on the right side of the drawing sheet. In this case, first formed are the electrically-conductive material film 5Z entirely covering the substrate 1 and the projections 4, the magnetoresistive effect films MR-A and MR-B, and the insulating film Z1, and thereafter, as illustrated in FIG. 14A, the two-layer resist pattern RP is formed that selectively covers the electrically-conductive material film 5Z. Next, as illustrated in FIG. 14B, the insulating film Z1 and the electrically-conductive material film 5Z are selectively etched using the two-layer resist pattern RP as a mask. In other words, portions of the insulating film Z1 and the electrically-conductive material film 5Z that are not covered with the two-layer resist pattern RP are removed. The lower wiring line 53 and the lower wiring line 52 are thus formed respectively on the inclined surface 4A and the inclined surface 4B of the projection 4L. At this time, a redeposit RD deposits on, for example, an end face of the two-layer resist pattern RP provided on the inclined surface 4A. The redeposit RD may result from, for example, a flying substance generated during etching of the insulating film Z1 and the electrically-conductive material film 5Z formed on the inclined surface 4B of the projection 4R opposed to the projection 4L. Such a deposit sometimes remains as a burr at an edge of the lower wiring line 53 formed on the inclined surface 4A of the projection 4L even after the two-layer resist pattern RP is lifted off. Such a burr can hinder the formation of the upper wiring line group 6 as an upper layer above the lower wiring line 53 or can become a cause of an unintentional short circuit between the lower wiring line 53 and the upper wiring line group 6. To cope with this, the dummy pattern DB may be provided on the inclined surface 4B as in the magnetic field detection apparatus 100C according to the present modification example. This makes it possible to effectively suppress burr generation at the lower wiring line 53 to be formed on the inclined surface 4A opposed to the inclined surface 4B provided with the dummy pattern DB.

As illustrated in FIG. 13, in a height direction (the Z-axis direction) orthogonal to the flat surface 1S, a top end position DBH of the dummy pattern DB with respect to, for example, the flat surface 1S may be substantially the same as a top end position 53H of the lower wiring line 53 with respect to the flat surface 1S. One reason for this is that, in such a case, it is possible to effectively suppress the burr generation on the lower wiring line 53, as compared with a case where the top end position DBH and the top end position 53H are different in the Z-axis direction.

The dummy pattern DB may be a structure that is not coupled to any of electronic devices, including the magnetoresistive effect films MR-A and MR-B, or to any of wiring lines used for communications or power supply, including the lower wiring line group 5 and the upper wiring line group 6. Thus, the dummy pattern DB may be insulated from both the lower wiring line group 5 and the upper wiring line group 6, although the dummy pattern DB may include an electrically-conductive material, for example. Note that a constituent material of the dummy pattern DB may be that same as, for example, the constituent material of the lower wiring line group 5 and the constituent material of the upper wiring line group 6. One reason for this is that, in such a case, it is possible to form the dummy pattern DB at the same time as the lower wiring line group 5 or the upper wiring line group 6, which improves easiness of manufacture. In the present modification example, the one or more dummy patterns DB may be provided on the inclined surface 4B; however, in some embodiments of the disclosure, one or more patterns usable as real wiring lines may be provided on the inclined surface 4B. The one or more patterns usable as real wiring lines may each be a third wiring line insulated from both the lower wiring line group 5 and the upper wiring line group 6. Thus, concepts of the "pattern" according to one embodiment of the disclosure include both a dummy pattern not usable as a real wiring line and a pattern usable as a real wiring line.

Although FIG. 12 illustrates a configuration example in which the one or more dummy patterns DB are provided between the inclined surface 4B and the upper wiring line 63, an embodiment of the disclosure is not limited thereto. In some embodiments, the one or more dummy patterns DB may be provided between the inclined surface 4B and the lower wiring line 53. The one or more dummy patterns DB provided on the inclined surface 4B do not necessarily have to be covered with the upper wiring line 63 or the lower wiring line 53.

In some embodiments, one or more dummy patterns may be provided on the inclined surface 4A, rather than providing any dummy pattern on the inclined surface 4B. In any of such embodiments, the one or more dummy patterns may be provided between the inclined surface 4A and the upper wiring line 63, or may be provided between the inclined surface 4A and the lower wiring line 53. The one or more dummy patterns provided on the inclined surface 4A do not necessarily have to be covered with the upper wiring line 63 or the lower wiring line 53.

Fourth Modification Example

Figure 15:
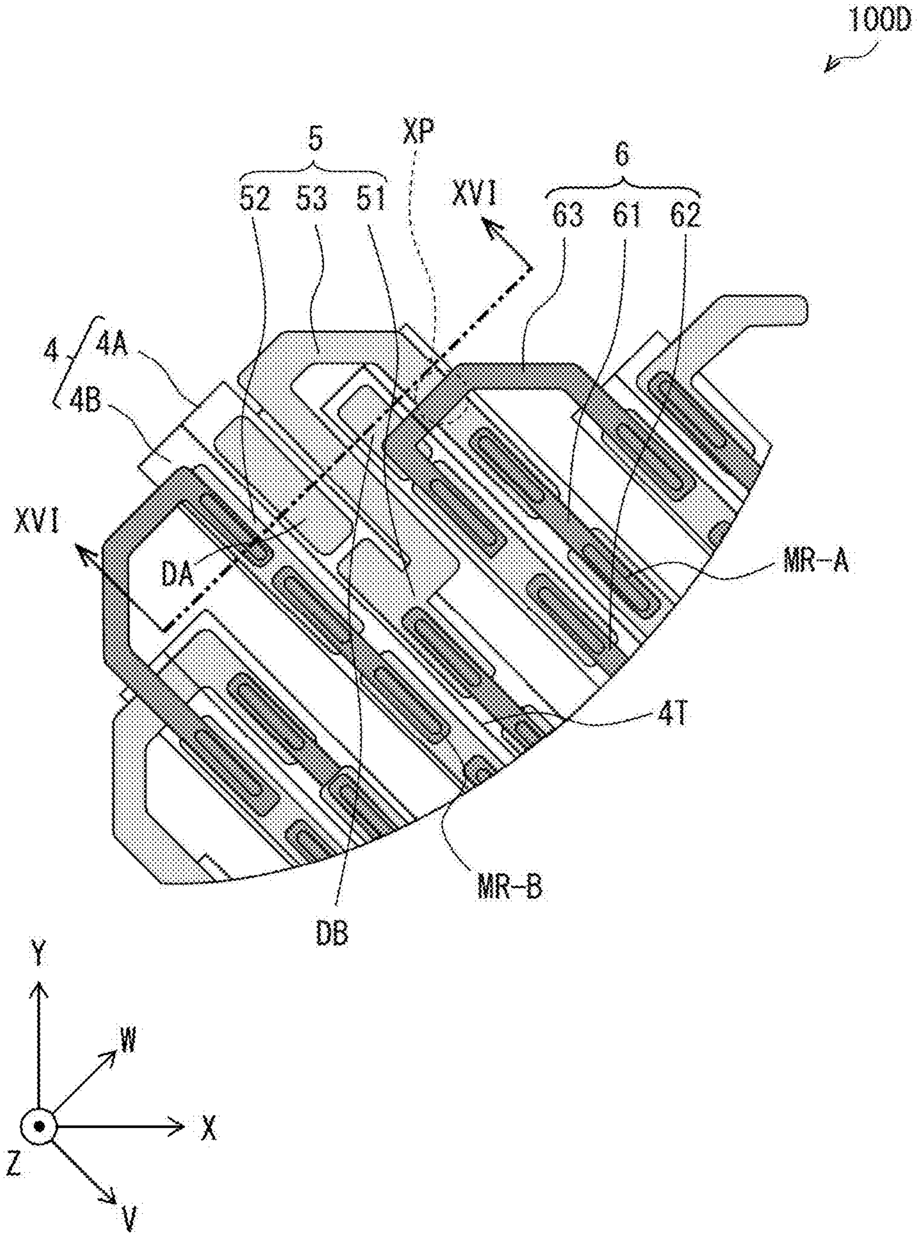
FIG. 15 is a schematic plan diagram illustrating a configuration example of a portion of a magnetic field detection apparatus according to a fourth modification example of one example embodiment of the disclosure.
Figure 16:
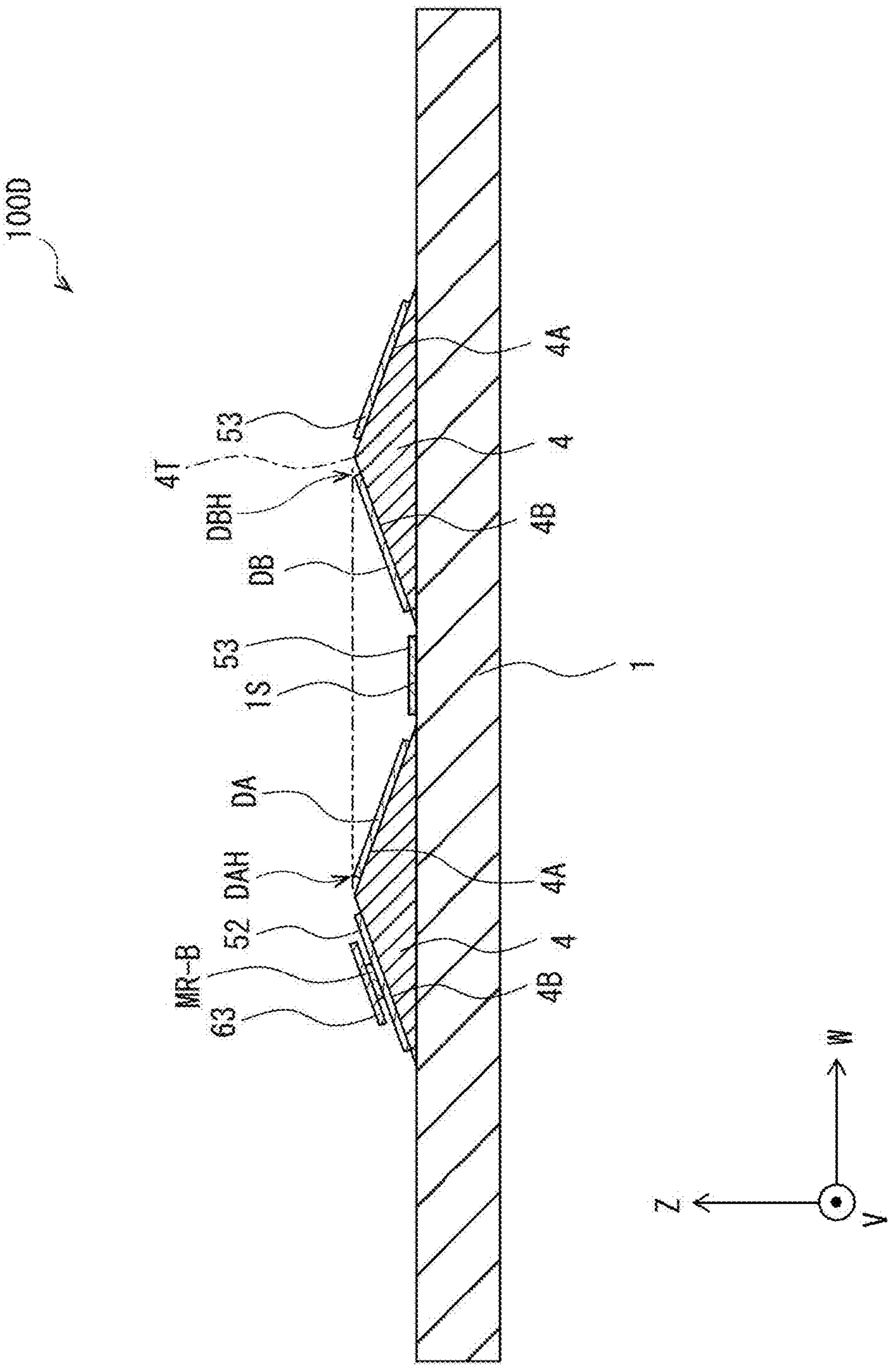
FIG. 16 is a schematic cross-sectional diagram illustrating a configuration example of a portion of the magnetic field detection apparatus according to the fourth modification example illustrated in FIG. 15.

In some embodiments of the disclosure, the dummy pattern may be formed on each of two inclined surfaces opposed to each other. FIGS. 15 and 16 illustrate a magnetic field detection apparatus 100D according to a fourth modification example. As illustrated, for example, one or more dummy patterns DB may be provided on the inclined surface 4B and one or more dummy patterns DA may be provided on the inclined surface 4A. FIG. 15 is a schematic plan view of a portion of the magnetic field detection apparatus 100D according to the fourth modification example of the foregoing example embodiment of the disclosure. FIG. 16 illustrates a cross section taken along line XVI-XVI in FIG. 15 as viewed in the arrowed direction. In this case, in the height direction (the Z-axis direction) orthogonal to the flat surface 1S, a top end position DAH of the dummy pattern DA with respect to, for example, the flat surface 1S may be substantially the same as the top end position DBH of the dummy pattern DB with respect to the flat surface 1S.

By providing the dummy pattern DA and the dummy pattern DB respectively on the inclined surface 4A and the inclined surface 4B opposed to each other as in the magnetic field detection apparatus 100D, it is possible to uniformize a distribution density of the resist pattern to be formed to cover the flat surface 1S and the projections 4 in forming the lower wiring line group 5. Thus, it is possible to reduce a density difference between a region where the resist pattern covering the flat surface 1S and the projections 4 is formed in high density and a region where the resist pattern covering the flat surface 1S and the projections 4 is formed in low density. As a result, it is possible to control, with higher accuracy, the dimensions and shape of the resist pattern to be used in performing exposure or development. Accordingly, it is possible to reduce variations in dimension of the lower wiring line group 5 to be formed using the resist pattern. Furthermore, it is possible to reduce an influence of exposure halation from the inclined surface 4A or the inclined surface 4B that can be experienced in a case of forming the lower wiring line 53 to cut across the flat surface 1S in a region sandwiched between two adjacent projections 4. Such exposure halation from the inclined surface 4A or the inclined surface 4B can deform the shape of the resist pattern to be used for patterning the lower wiring line 53. This can reduce dimensional accuracy of the lower wiring line 53. Accordingly, by providing the dummy pattern DA and the dummy pattern DB respectively on the inclined surface 4A and the inclined surface 4B opposed to each other as in the magnetic field detection apparatus 100D, it is possible to reduce halation upon exposure to thereby prevent a reduction in dimensional accuracy of the lower wiring line 53. In the present modification example, the one or more dummy patterns DA may be provided on the inclined surface 4A and the one or more dummy patterns DB may be provided on the inclined surface 4B; however, in some embodiments of the disclosure, one or more patterns usable as real wiring lines may be provided on each of the inclined surfaces 4A and 4B. The one or more patterns usable as real wiring lines may each be the third wiring line insulated from both the lower wiring line group 5 and the upper wiring line group 6. Thus, the concepts of the "pattern" according to one embodiment of the disclosure include both the dummy pattern not usable as a real wiring line and the pattern usable as a real wiring line.

Although FIG. 15 illustrates a configuration example in which the one or more dummy patterns DB are provided between the inclined surface 4B and the upper wiring line 63, this is non-limiting. In some embodiments, the one or more dummy patterns DB may be provided between the inclined surface 4B and the lower wiring line 53. The one or more dummy patterns DB provided on the inclined surface 4B do not necessarily have to be covered with the upper wiring line 63 or the lower wiring line 53.

In the example illustrated in FIG. 15, the one or more dummy patterns DA provided on the inclined surface 4A are not covered with the upper wiring line 63 or the lower wiring line 53. However, in some embodiments, the one or more dummy patterns DA may be provided between the inclined surface 4A and the upper wiring line 63, or between the inclined surface 4A and the lower wiring line 53.

In the schematic plan view illustrated in FIG. 3, the projections 4 each have a rectangular plan shape with a longitudinal direction thereof along the V-axis direction; however, the plan shape of the projections 4 is not limited thereto in any embodiment of the disclosure. For example, the projections 4 may each be shaped like a race track in outline, with each of opposite ends in the longitudinal direction being semicircular. Further, although FIG. 4 illustrates an example case where the inclined surfaces 4A and 4B are both planar, the inclined surfaces 4A and 4B may both be curved. Further, in the example illustrated in FIG. 4, the top part 4T is illustrated as a vertex of a corner at which the inclined surface 4A and the inclined surface 4B meet; however, the top part 4T may be round in cross section.

Figure 17:
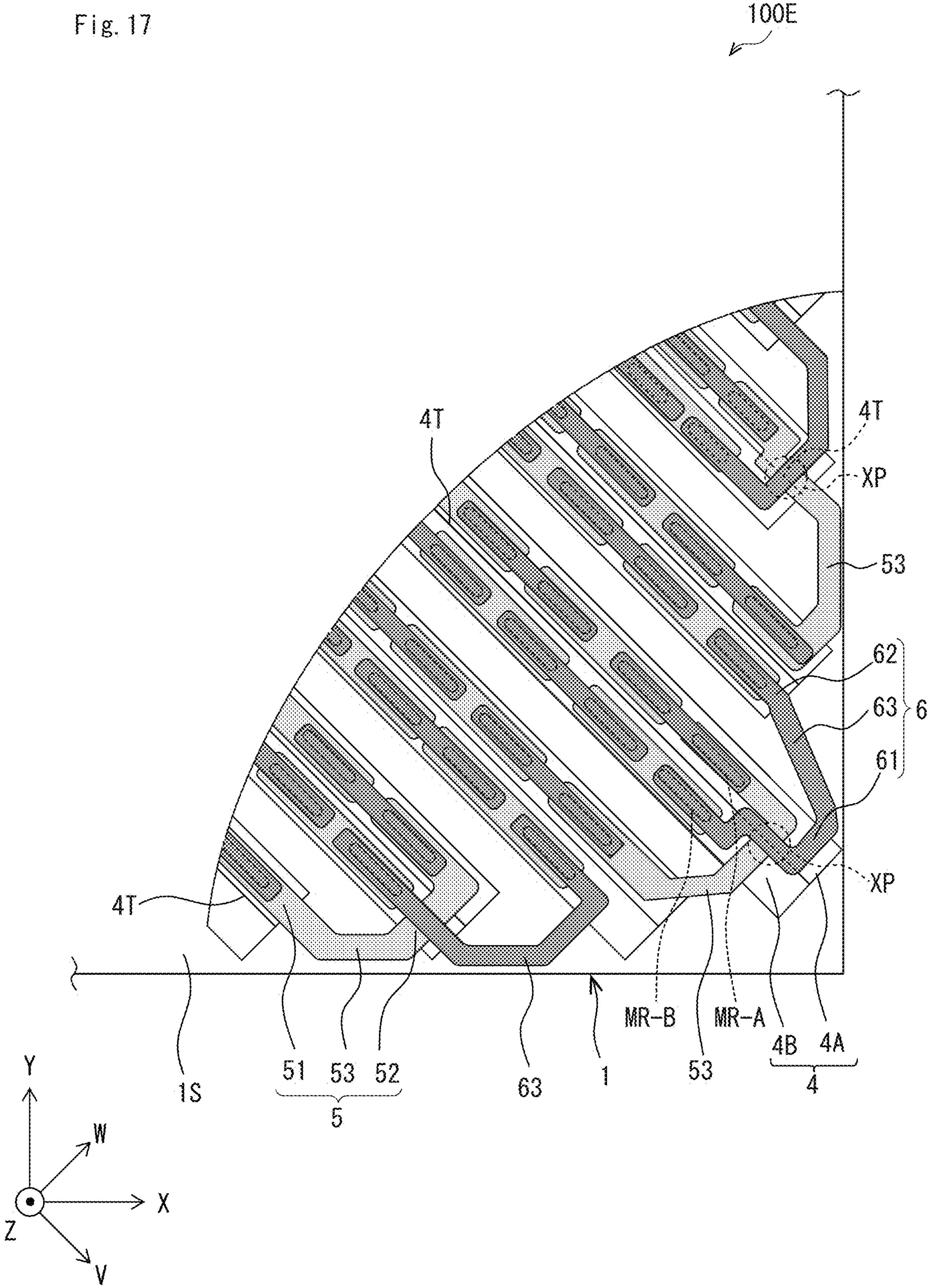
FIG. 17 is a schematic plan diagram illustrating a partial configuration example of a magnetic field detection apparatus according to a fifth modification example of one example embodiment of the disclosure.

In the magnetic field detection apparatus 100 according to the example embodiment illustrated in, for example, FIG. 3, the lower wiring line 53 and the upper wiring line 63 may intersect on the inclined surface 4A, the inclined surface 4B, or both; however, the magnetic field detection apparatus according to an embodiment of the disclosure is not limited thereto. For example, as in a magnetic field detection apparatus 100E according to a fifth modification example illustrated in FIG. 17, the lower wiring line 53 and the upper wiring line 63 may intersect at a location overlapping, in the Z-axis direction, the top part 4T of the projection 4. In other words, a cross point XP may be formed directly on the top part 4T in the Z-axis direction. An insulating layer may be provided between the lower wiring line 53 and the upper wiring line 63. FIG. 17 is a partial schematic plan view of the magnetic field detection apparatus 100E according to the fifth modification example of the foregoing example embodiment of the disclosure. In the magnetic field detection apparatus 100E, the upper wiring line 63 may be provided to intersect, in the W-axis direction, a portion of the lower wiring line 53 that extends in the V-axis direction, or may be provided to intersect, in the V-axis direction, a portion of the lower wiring line 53 that straddles the top part 4T in the W-axis direction.

By causing the cross point XP between the lower wiring line 53 and the upper wiring line 63 to be present on the top part 4T of the projection 4 as in the magnetic field detection apparatus 100E, a distance from the flat surface 1S to the cross point XP increases as compared with that in the magnetic field detection apparatus 100. This helps to more effectively suppress the burr generation at the lower wiring line 53, which in turn helps to more effectively avoid unintended continuity between the lower wiring line 53 and the upper wiring line 63.

In the magnetic field detection apparatus 100E, as illustrated in FIG. 17, the lower wiring line group 5 may include the lower wiring line 51 provided on a first projection 4 of the projections 4, the lower wiring line 52 provided on a second projection 4 of the projections 4 that is adjacent to the first projection 4, and the lower wiring line 53 coupling the lower wiring line 51 and the lower wiring line 52 to each other. The lower wiring line group 5 may couple the magnetoresistive effect film MR-A provided on the inclined surface 4A of one of the projections 4 and the magnetoresistive effect film MR-A provided on the inclined surface 4A of a different one of the projections 4 to each other, or may couple the magnetoresistive effect film MR-B provided on the inclined surface 4B of one of the projections 4 and the magnetoresistive effect film MR-B provided on the inclined surface 4B of a different one of the projections 4 to each other. The magnetic field detection apparatus 100E may have a configuration in which, for example, the lower wiring line 51 is provided on the inclined surface 4A of the first projection 4 and the lower wiring line 52 is provided on the inclined surface 4A of the second projection 4. As another example, the magnetic field detection apparatus 100E may have a configuration in which the lower wiring line 51 is provided on the inclined surface 4B of the first projection 4 and the lower wiring line 52 is provided on the inclined surface 4B of the second projection 4. The lower wiring line 51 may correspond to a specific but non-limiting example of a "third inclined part" according to one embodiment of the disclosure. The lower wiring line 52 may correspond to a specific but non-limiting example of a "fourth inclined part"

according to one embodiment of the disclosure. The lower wiring line 53 may correspond to a specific but non-limiting example of a "coupling part" according to one embodiment of the disclosure. The lower wiring line group 5 may correspond to a specific but non-limiting example of a "first wiring line" according to one embodiment of the disclosure. In the magnetic field detection apparatus 100E, as viewed in a Z direction perpendicular to the flat surface 1S, the lower wiring line 53 may include a region that extends at an angle greater than 0 degrees and less than 90 degrees with respect to both a direction in which the lower wiring line 51 extends and a direction in which the lower wiring line 52 extends.

Figure 18:
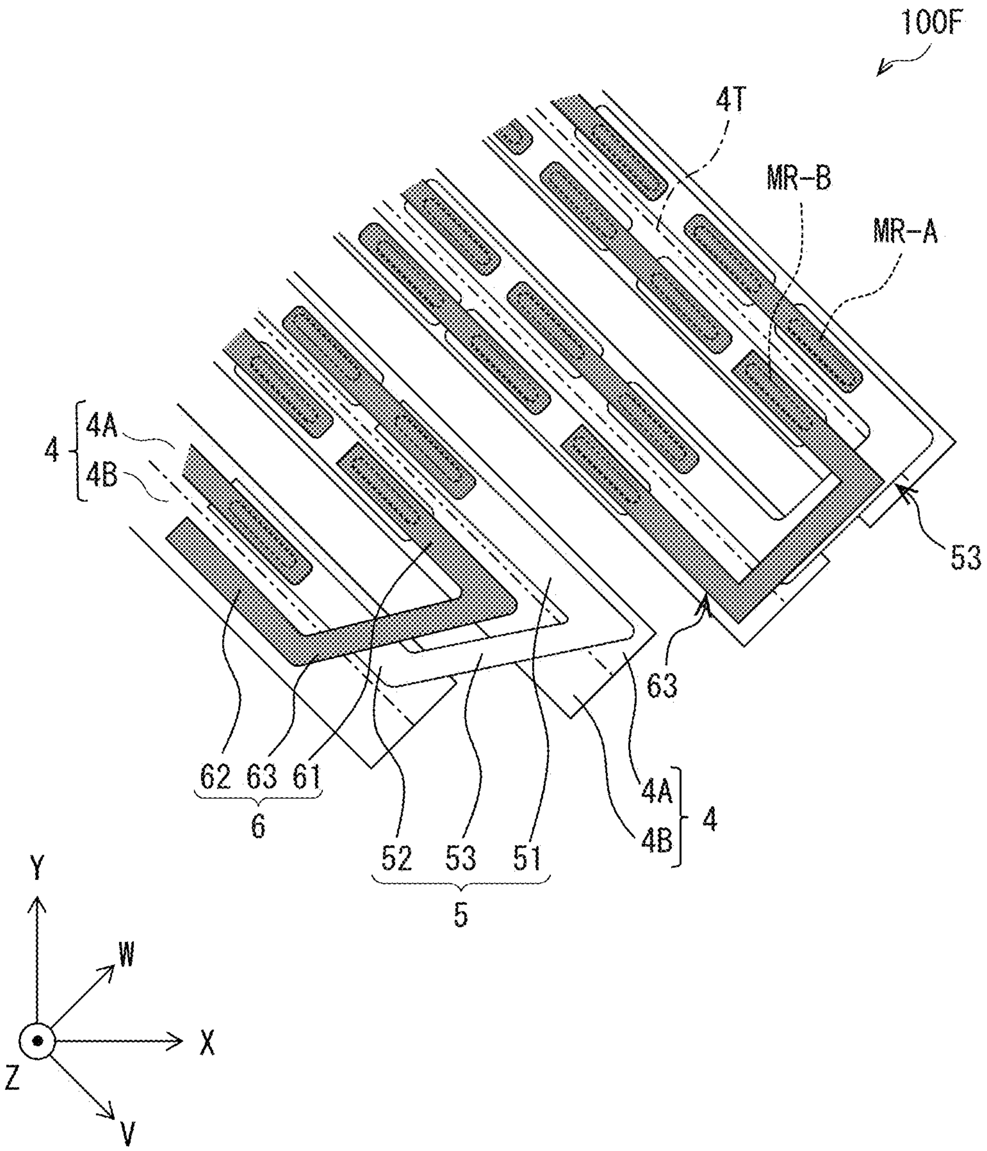
FIG. 18 is a schematic plan diagram illustrating a partial configuration example of a magnetic field detection apparatus according to a sixth modification example of one example embodiment of the disclosure.

FIG. 18 is a partial schematic plan view of a magnetic field detection apparatus 100F according to a sixth modification example of the foregoing example embodiment of the disclosure. In the magnetic field detection apparatus 100F, as illustrated in FIG. 18, the upper wiring line group 6 may include the upper wiring line 61 provided on the first projection 4 of the projections 4, the upper wiring line 62 provided on the second projection 4 of the projections 4 that is adjacent to the first projection 4, and the upper wiring line 63 coupling the upper wiring line 61 and the upper wiring line 62 to each other. In the magnetic field detection apparatus 100F, as viewed in the Z direction perpendicular to the flat surface 1S, the upper wiring line 63 may include a region that extends at an angle greater than 0 degrees and less than 90 degrees with respect to both a direction in which the upper wiring line 61 extends and a direction in which the upper wiring line 62 extends. As illustrated in FIG. 18, the upper wiring line group 6 may couple the magnetoresistive effect film MR-B provided on the inclined surface 4B of one of the projections 4 and the magnetoresistive effect film MR-B provided on the inclined surface 4B of a different one of the projections 4 to each other. As another example, the upper wiring line group 6 may couple the magnetoresistive effect film MR-A provided on the inclined surface 4A of one of the projections 4 and the magnetoresistive effect film MR-A provided on the inclined surface 4A of a different one of the projections 4 to each other. Further, in the magnetic field detection apparatus 100F, as illustrated in FIG. 18, the lower wiring line group 5 may include the lower wiring line 51 provided on the first projection 4 of the projections 4, the lower wiring line 52 provided on the second projection 4 of the projections 4 that is adjacent to the first projection 4, and the lower wiring line 53 coupling the lower wiring line 51 and the lower wiring line 52 to each other. In the magnetic field detection apparatus 100F, as viewed in the Z direction perpendicular to the flat surface 1S, the lower wiring line 53 may include a region that extends at an angle greater than 0 degrees and less than 90 degrees with respect to both the direction in which the lower wiring line 51 extends and the direction in which the lower wiring line 52 extends. In the example illustrated in FIG. 18, the lower wiring line 51 may be provided on the inclined surface 4A of the first projection 4 and the lower wiring line 52 may be provided on the inclined surface 4A of the second projection 4. In some embodiments, the lower wiring line 51 may be provided on the inclined surface 4B of the first projection 4 and the lower wiring line 52 may be provided on the inclined surface 4B of the second projection 4.

Furthermore, the disclosure encompasses any possible combination of some or all of the various embodiments and the modifications described herein and incorporated herein.

It is possible to achieve at least the following configurations from the foregoing embodiments and modification examples of the disclosure.

(1)

1. A magnetic field detection apparatus comprising:
2. a substrate including a flat surface;
3. multiple projections including a first projection and a second projection, each of the multiple projections being provided on the flat surface and including a first inclined surface and a second inclined surface, the first inclined surface being inclined with respect to the flat surface, the second inclined surface being inclined with respect to both the flat surface and the first inclined surface;
4. a first magnetoresistive effect film provided on the first inclined surface;
5. a second magnetoresistive effect film provided on the second inclined surface; and
6. a first wiring line coupling the first magnetoresistive effect film provided on the first inclined surface of the first projection of the multiple projections and the first magnetoresistive effect film provided on the first inclined surface of the second projection of the multiple projections to each other, wherein
7. the first wiring line includes a first flat part and a first inclined part, the first flat part being provided on the flat surface and extending in a first direction, the first inclined part being provided on the first inclined surface and extending in a second direction, and
8. the first flat part is coupled to a middle region of the first inclined part, the middle region being in the second direction and other than both end regions of the first inclined part that are in the second direction.

(2)

1. A magnetic field detection apparatus comprising:
2. a substrate including a flat surface;
3. multiple projections including a first projection, a second projection, and a third projection, each of the multiple projections being provided on the flat surface and including a first inclined surface and a second inclined surface, the first inclined surface being inclined with respect to the flat surface, the second inclined surface being inclined with respect to both the flat surface and the first inclined surface;
4. a first magnetoresistive effect film provided on the first inclined surface;
5. a second magnetoresistive effect film provided on the second inclined surface;
6. a first wiring line coupling the first magnetoresistive effect film provided on the first inclined surface of the first projection of the multiple projections and the first magnetoresistive effect film provided on the first inclined surface of the second projection of the multiple projections to each other;
7. a second wiring line coupling the second magnetoresistive effect film provided on the second inclined surface of the first projection of the multiple projections and the second magnetoresistive effect film provided on the second inclined surface of the third projection of the multiple projections to each other; and
8. one or more patterns, wherein
9. the first to third projections are adjacent to each other in a first direction, with the first inclined surface and the second inclined surface being opposed to each other in the first direction, and
10. the one or more patterns are provided on the first inclined surface, the second inclined surface, or both, of the first inclined surface and the second inclined surface that are opposed to each other.

(3)

1. The magnetic field detection apparatus according to (2), wherein the one or more patterns include a first pattern and a second pattern, the first pattern being provided on the first inclined surface, the second pattern being provided on the second inclined surface.

(4)

1. The magnetic field detection apparatus according to (3), wherein, in a height direction orthogonal to the flat surface, a top end position of the first pattern with respect to the flat surface is substantially same as a top end position of the second pattern with respect to the flat surface.

(5)

1. The magnetic field detection apparatus according to (2), wherein
2. the one or more patterns are provided on the second inclined surface of the second projection, and
3. the first wiring line is provided on the first inclined surface of the first projection opposed to the second inclined surface of the second projection on which the one or more patterns are provided.

(6)

1. The magnetic field detection apparatus according to (5), wherein, in a height direction orthogonal to the flat surface, a top end position of the one or more patterns with respect to the flat surface is substantially same as a top end position of the first wiring with respect to the flat surface.

(7)

1. The magnetic field detection apparatus according to (2), further comprising a third wiring line, wherein
2. the one or more patterns are provided on the second inclined surface of the second projection,
3. the first wiring line, the third wiring line, and a plurality of the first magnetoresistive effect films are provided on the first inclined surface of the first projection opposed to the second inclined surface of the second projection on which the one or more patterns are provided,
4. the third wiring line couples two of the first magnetoresistive effect films provided on the first inclined surface of the first projection to each other, and
5. one of the two first magnetoresistive effect films coupled to each other by the third wiring line is disposed between the first wiring line and the third wiring line in a height direction orthogonal to the flat surface.

(8)

1. The magnetic field detection apparatus according to (7), wherein the one or more patterns include an electrically-conductive material, and are insulated from each of the first to third wiring lines.

(9)

1. The magnetic field detection apparatus according to (8), wherein a constituent material of the one or more patterns is same as a constituent material of the first wiring line and a constituent material of the second wiring line.

(10)

1. The magnetic field detection apparatus according to (2), wherein
2. the first wiring line includes a first flat part and a first inclined part, the first flat part being provided on the flat surface and extending in the first direction, the first inclined part being provided on the first inclined surface or the second inclined surface and extending in a second direction, and
3. the first flat part is coupled to a middle region of the first inclined part, the middle region being in the second direction and other than both end regions of the first inclined part that are in the second direction.

(11)

1. The magnetic field detection apparatus according to (10), wherein the first direction and the second direction are substantially orthogonal to each other.

(12)

1. The magnetic field detection apparatus according to (1), wherein the first magnetoresistive effect film, the second magnetoresistive effect film, or each of the first magnetoresistive effect film and the second magnetoresistive effect film includes a magnetization free layer having a magnetic vortex structure.

(13)

1. A magnetic field detection apparatus comprising:
2. a substrate including a flat surface;
3. multiple projections including a first projection and a second projection, each of the multiple projections being provided on the flat surface and including a first inclined surface and a second inclined surface, the first inclined surface being inclined with respect to the flat surface, the second inclined surface being inclined with respect to both the flat surface and the first inclined surface;
4. a first magnetoresistive effect film provided on the first inclined surface;
5. a second magnetoresistive effect film provided on the second inclined surface;
6. a first wiring line coupling the first magnetoresistive effect film provided on the first inclined surface of the first projection of the multiple projections and the first magnetoresistive effect film provided on the first inclined surface of the second projection of the multiple projections to each other; and
7. one or more patterns, wherein
8. the first wiring line includes an inclined part provided on the flat inclined surface, and
9. the one or more patterns are provided between the first inclined surface and the inclined part of the first wiring line.

(14)

1. A magnetic field detection apparatus comprising:
2. a substrate including a flat surface;
3. multiple projections including a first projection, a second projection, and a third projection, each of the multiple projections being provided on the flat surface and including a first inclined surface and a second inclined surface, the first inclined surface being inclined with respect to the flat surface, the second inclined surface being inclined with respect to both the flat surface and the first inclined surface;
4. a first magnetoresistive effect film provided on the first inclined surface;
5. a second magnetoresistive effect film provided on the second inclined surface;
6. a first wiring line coupling the first magnetoresistive effect film provided on the first inclined surface of the first projection of the multiple projections and the first magnetoresistive effect film provided on the first inclined surface of the second projection of the multiple projections to each other; and
7. a second wiring line coupling the second magnetoresistive effect film provided on the second inclined surface of the first projection of the multiple projections and the second magnetoresistive effect film provided on the second inclined surface of the second projection or the third projection of the multiple projections to each other; wherein 8. the first wiring line and the second wiring line intersect on a top part of the first projection, a top part of the second projection, or both.

(15)

1. A magnetic field detection apparatus comprising:
2. a substrate including a flat surface;
3. multiple projections including a first projection and a second projection, each of the multiple projections being provided on the flat surface and including a first inclined surface and a second inclined surface, the first inclined surface being inclined with respect to the flat surface, the second inclined surface being inclined with respect to both the flat surface and the first inclined surface;
4. a first magnetoresistive effect film provided on the first inclined surface;
5. a second magnetoresistive effect film provided on the second inclined surface; and
6. a first wiring line coupling the first magnetoresistive effect film provided on the first inclined surface of one of the multiple projections and the first magnetoresistive effect film provided on the first inclined surface of a different one of the multiple projections to each other, wherein
7. the first wiring line includes a third inclined part, a fourth inclined part, and a coupling part coupling the third inclined part and the fourth inclined part to each other, the third inclined part being provided on the first inclined surface of the first projection of the multiple projections, the fourth inclined part being provided on the first inclined surface of the second projection of the multiple projections, and
8. as viewed in a direction perpendicular to the flat surface, the coupling part includes a region that extends at an angle different from 90 degrees with respect to both a direction in which the third inclined part extends and a direction in which the fourth inclined part extends.

(16)

1. The magnetic field detection apparatus according to (2), wherein
2. the first projection and the second projection are adjacent to each other in the first direction, with the first inclined surface of the first projection and the second inclined surface of the second projection being opposed to each other in the first direction, and
3. the first projection and the third projection are adjacent to each other in the first direction, with the second inclined surface of the first projection and the first inclined surface of the third projection being opposed to each other in the first direction.

(17)

1. The magnetic field detection apparatus according to (2), wherein the first magnetoresistive effect film, the second magnetoresistive effect film, or each of the first magnetoresistive effect film and the second magnetoresistive effect film includes a magnetization free layer having a magnetic vortex structure.

(18)

1. The magnetic field detection apparatus according to (13), wherein the first magnetoresistive effect film, the second magnetoresistive effect film, or each of the first magnetoresistive effect film and the second magnetoresistive effect film includes a magnetization free layer having a magnetic vortex structure.

(19)

1. The magnetic field detection apparatus according to (14), wherein the first magnetoresistive effect film, the second magnetoresistive effect film, or each of the first magnetoresistive effect film and the second magnetoresistive effect film includes a magnetization free layer having a magnetic vortex structure.

(20)

1. The magnetic field detection apparatus according to (15), wherein the first magnetoresistive effect film, the second magnetoresistive effect film, or each of the first magnetoresistive effect film and the second magnetoresistive effect film includes a magnetization free layer having a magnetic vortex structure.

Although the disclosure has been described hereinabove in terms of the example embodiment and modification examples, the disclosure is not limited thereto. It should be appreciated that variations may be made in the described example embodiment and modification examples by those skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. The use of the terms first, second, etc. do not denote any order or importance, but rather the terms first, second, etc. are used to distinguish one element from another. The term "substantially" and its variants are defined as being largely but not necessarily wholly what is specified as understood by one of ordinary skill in the art. The term "disposed on/provided on/formed on" and its variants as used herein refer to elements disposed directly in contact with each other or indirectly by having intervening structures therebetween. The term "preferably", "preferred" or the like is non-exclusive and means "preferably", but not limited to. Moreover, no element or component in this disclosure is intended to be dedicated to the public regardless of whether the element or component is explicitly recited in the following claims.

What is claimed is:

1. A magnetic field detection apparatus comprising:

a substrate including a flat surface;

multiple projections including a first projection and a second projection, each of the multiple projections being provided on the flat surface and including a first inclined surface and a second inclined surface, the first inclined surface being inclined with respect to the flat surface, the second inclined surface being inclined with respect to both the flat surface and the first inclined surface;

a first magnetoresistive effect film provided on the first inclined surface;

a second magnetoresistive effect film provided on the second inclined surface; and a first wiring line coupling the first magnetoresistive effect film provided on the first inclined surface of the first projection of the multiple projections and the first magnetoresistive effect film provided on the first inclined surface of the second projection of the multiple projections to each other, wherein the first wiring line includes a first flat part and a first inclined part, the first flat part being provided on the flat surface and extending in a first direction, the first inclined part being provided on the first inclined surface and extending in a second direction, and the first flat part is coupled to a middle region of the first inclined part, the middle region being in the second direction and other than both end regions of the first inclined part that are in the second direction.

2. A magnetic field detection apparatus comprising:

a substrate including a flat surface;

multiple projections including a first projection, a second projection, and a third projection, each of the multiple projections being provided on the flat surface and including a first inclined surface and a second inclined surface, the first inclined surface being inclined with respect to the flat surface, the second inclined surface being inclined with respect to both the flat surface and the first inclined surface;

a first magnetoresistive effect film provided on the first inclined surface;

a second magnetoresistive effect film provided on the second inclined surface;

a first wiring line coupling the first magnetoresistive effect film provided on the first inclined surface of the first projection of the multiple projections and the first magnetoresistive effect film provided on the first inclined surface of the second projection of the multiple projections to each other;

a second wiring line coupling the second magnetoresistive effect film provided on the second inclined surface of the first projection of the multiple projections and the second magnetoresistive effect film provided on the second inclined surface of the third projection of the multiple projections to each other; and one or more patterns, wherein the first to third projections are adjacent to each other in a first direction, with the first inclined surface and the second inclined surface being opposed to each other in the first direction, and the one or more patterns are provided on the first inclined surface, the second inclined surface, or both, of the first inclined surface and the second inclined surface that are opposed to each other.

3. The magnetic field detection apparatus according to claim 2, wherein the one or more patterns include a first pattern and a second pattern, the first pattern being provided on the first inclined surface, the second pattern being provided on the second inclined surface.

4. The magnetic field detection apparatus according to claim 3, wherein, in a height direction orthogonal to the flat surface, a top end position of the first pattern with respect to the flat surface is substantially same as a top end position of the second pattern with respect to the flat surface.

5. The magnetic field detection apparatus according to claim 2, wherein the one or more patterns are provided on the second inclined surface of the second projection, and the first wiring line is provided on the first inclined surface of the first projection opposed to the second inclined surface of the second projection on which the one or more patterns are provided.

6. The magnetic field detection apparatus according to claim 5, wherein, in a height direction orthogonal to the flat surface, a top end position of the one or more patterns with respect to the flat surface is substantially same as a top end position of the first wiring with respect to the flat surface.

7. The magnetic field detection apparatus according to claim 2, further comprising a third wiring line, wherein the one or more patterns are provided on the second inclined surface of the second projection, the first wiring line, the third wiring line, and a plurality of the first magnetoresistive effect films are provided on the first inclined surface of the first projection opposed to the second inclined surface of the second projection on which the one or more patterns are provided, the third wiring line couples two of the first magnetoresistive effect films provided on the first inclined surface of the first projection to each other, and one of the two first magnetoresistive effect films coupled to each other by the third wiring line is disposed between the first wiring line and the third wiring line in a height direction orthogonal to the flat surface.

8. The magnetic field detection apparatus according to claim 7, wherein the one or more patterns include an electrically-conductive material, and are insulated from each of the first to third wiring lines.

9. The magnetic field detection apparatus according to claim 8, wherein a constituent material of the one or more patterns is same as a constituent material of the first wiring line and a constituent material of the second wiring line.

10. The magnetic field detection apparatus according to claim 2, wherein the first wiring line includes a first flat part and a first inclined part, the first flat part being provided on the flat surface and extending in the first direction, the first inclined part being provided on the first inclined surface or the second inclined surface and extending in a second direction, and the first flat part is coupled to a middle region of the first inclined part, the middle region being in the second direction and other than both end regions of the first inclined part that are in the second direction.

11. The magnetic field detection apparatus according to claim 10, wherein the first direction and the second direction are substantially orthogonal to each other.

12. The magnetic field detection apparatus according to claim 1, wherein the first magnetoresistive effect film, the second magnetoresistive effect film, or each of the first magnetoresistive effect film and the second magnetoresistive effect film includes a magnetization free layer having a magnetic vortex structure.

13. A magnetic field detection apparatus comprising:

a substrate including a flat surface;

multiple projections including a first projection and a second projection, each of the multiple projections being provided on the flat surface and including a first inclined surface and a second inclined surface, the first inclined surface being inclined with respect to the flat surface, the second inclined surface being inclined with respect to both the flat surface and the first inclined surface;

a first magnetoresistive effect film provided on the first inclined surface;

a second magnetoresistive effect film provided on the second inclined surface;

a first wiring line coupling the first magnetoresistive effect film provided on the first inclined surface of the first projection of the multiple projections and the first magnetoresistive effect film provided on the first inclined surface of the second projection of the multiple projections to each other; and one or more patterns, wherein the first wiring line includes an inclined part provided on the flat inclined surface, and the one or more patterns are provided between the first inclined surface and the inclined part of the first wiring line.

14. A magnetic field detection apparatus comprising:

a substrate including a flat surface;

multiple projections including a first projection, a second projection, and a third projection, each of the multiple projections being provided on the flat surface and including a first inclined surface and a second inclined surface, the first inclined surface being inclined with respect to the flat surface, the second inclined surface being inclined with respect to both the flat surface and the first inclined surface;

a first magnetoresistive effect film provided on the first inclined surface;

a second magnetoresistive effect film provided on the second inclined surface;

a first wiring line coupling the first magnetoresistive effect film provided on the first inclined surface of the first projection of the multiple projections and the first magnetoresistive effect film provided on the first inclined surface of the second projection of the multiple projections to each other; and a second wiring line coupling the second magnetoresistive effect film provided on the second inclined surface of the first projection of the multiple projections and the second magnetoresistive effect film provided on the second inclined surface of the second projection or the third projection of the multiple projections to each other; wherein the first wiring line and the second wiring line intersect on a top part of the first projection, a top part of the second projection, or both.

15. A magnetic field detection apparatus comprising:

a substrate including a flat surface;

multiple projections including a first projection and a second projection, each of the multiple projections being provided on the flat surface and including a first inclined surface and a second inclined surface, the first inclined surface being inclined with respect to the flat surface, the second inclined surface being inclined with respect to both the flat surface and the first inclined surface;

a first magnetoresistive effect film provided on the first inclined surface;

a second magnetoresistive effect film provided on the second inclined surface; and a first wiring line coupling the first magnetoresistive effect film provided on the first inclined surface of one of the multiple projections and the first magnetoresistive effect film provided on the first inclined surface of a different one of the multiple projections to each other, wherein the first wiring line includes a third inclined part, a fourth inclined part, and a coupling part coupling the third inclined part and the fourth inclined part to each other, the third inclined part being provided on the first inclined surface of the first projection of the multiple projections, the fourth inclined part being provided on the first inclined surface of the second projection of the multiple projections, and as viewed in a direction perpendicular to the flat surface, the coupling part includes a region that extends at an angle different from 90 degrees with respect to both a direction in which the third inclined part extends and a direction in which the fourth inclined part extends.

16. The magnetic field detection apparatus according to claim 2, wherein the first projection and the second projection are adjacent to each other in the first direction, with the first inclined surface of the first projection and the second inclined surface of the second projection being opposed to each other in the first direction, and the first projection and the third projection are adjacent to each other in the first direction, with the second inclined surface of the first projection and the first inclined surface of the third projection being opposed to each other in the first direction.

17. The magnetic field detection apparatus according to claim 2, wherein the first magnetoresistive effect film, the second magnetoresistive effect film, or each of the first magnetoresistive effect film and the second magnetoresistive effect film includes a magnetization free layer having a magnetic vortex structure.

18. The magnetic field detection apparatus according to claim 13, wherein the first magnetoresistive effect film, the second magnetoresistive effect film, or each of the first magnetoresistive effect film and the second magnetoresistive effect film includes a magnetization free layer having a magnetic vortex structure.

19. The magnetic field detection apparatus according to claim 14, wherein the first magnetoresistive effect film, the second magnetoresistive effect film, or each of the first magnetoresistive effect film and the second magnetoresistive effect film includes a magnetization free layer having a magnetic vortex structure.

20. The magnetic field detection apparatus according to claim 15, wherein the first magnetoresistive effect film, the second magnetoresistive effect film, or each of the first magnetoresistive effect film and the second magnetoresistive effect film includes a magnetization free layer having a magnetic vortex structure.

* * * * *